United States Patent
Hwang

(10) Patent No.: US 9,299,949 B2
(45) Date of Patent: Mar. 29, 2016

(54) DISPLAY PANEL AND DISPLAY DEVICE

(71) Applicant: Samsung Display Co., Ltd., Yongin, Gyeonggi-Do (KR)

(72) Inventor: Won Mi Hwang, Jung-gu (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/282,626

(22) Filed: May 20, 2014

(65) Prior Publication Data

US 2015/0207094 A1 Jul. 23, 2015

(30) Foreign Application Priority Data

Jan. 23, 2014 (KR) .......................... 10-2014-0008272

(51) Int. Cl.
| | | |
|---|---|---|
| *H01L 29/10* | (2006.01) | |
| *H01L 51/52* | (2006.01) | |
| *H01L 27/32* | (2006.01) | |

(52) U.S. Cl.
CPC ........ *H01L 51/5203* (2013.01); *H01L 27/3276* (2013.01)

(58) Field of Classification Search
CPC ...................... H01L 27/3246; H01L 29/66765; H01L 27/1255; H01L 27/1288; H01L 27/1214; H01L 27/3276; H01L 29/78672; H01L 51/0011; H01L 51/5218
See application file for complete search history.

(56) References Cited

U.S. PATENT DOCUMENTS

| | | | | |
|---|---|---|---|---|
| 2004/0079937 | A1* | 4/2004 | Miyazawa | H05K 1/024 257/10 |
| 2006/0012737 | A1* | 1/2006 | Hirai | G02F 1/13363 349/114 |
| 2007/0076148 | A1* | 4/2007 | Yang | G02F 1/133555 349/114 |
| 2008/0163923 | A1* | 7/2008 | Park | H01G 9/2031 136/248 |
| 2008/0191210 | A1* | 8/2008 | Hiroshima | H01L 27/1214 257/59 |
| 2009/0243960 | A1 | 10/2009 | Mo | |
| 2009/0303423 | A1 | 12/2009 | Kim et al. | |

FOREIGN PATENT DOCUMENTS

| | | |
|---|---|---|
| KR | 10-1996-0043120 A | 12/1996 |
| KR | 10-0712123 B1 | 4/2007 |
| KR | 10-2009-0126765 A | 12/2009 |

* cited by examiner

*Primary Examiner* — Jaehwan Oh
(74) *Attorney, Agent, or Firm* — Robert E. Bushnell, Esq.

(57) ABSTRACT

A display panel and a display device, such as an organic light emitting panel that includes a spacer. The display panel and the display device include a semiconductor element including a first electrode; a passivation layer arranged on the semiconductor element and including a via hole exposing the first electrode; a second electrode arranged on the passivation layer and connected to the first electrode through the via hole; and a spacer arranged on the second electrode and adjacent to the via hole, wherein the spacer exposes at least a portion of a region where the via hole is formed.

20 Claims, 15 Drawing Sheets

DISPLAY PANEL AND DISPLAY DEVICE

CLAIM OR PRIORITY

This application claims priority to and the benefit of Korean Patent Application No. 10-2014-0008272 filed in the Korean Intellectual Property Office on Jan. 23, 2014, the entire contents of which are incorporated herein by reference.

BACKGROUND OF THE INVENTION

1. Field of the Invention

The present invention relates to a display panel and a display device. More particularly, the present invention relates to an organic light emitting panel including a spacer and a display device including the same.

2. Description of the Related Art

A display device such as a liquid crystal display (LCD), an organic light emitting diode (OLED) display, and an electrophoretic display includes a field generating electrode and an electro-optical active layer. For example, the organic light emitting diode (OLED) display device includes an organic light emitting layer as the electro-optical active layer. The field generating electrode is connected to a switching element such as a thin film transistor to receive a data signal, and the electro-optical active layer converts the data signal into an optical signal to display an image.

Among the display devices, since the organic light emitting diode (OLED) display as a self-light emitting type display device that does not require a separate light source, it is advantageous in terms of power consumption, response speed, viewing angle, and contrast ratio.

The organic light emitting diode (OLED) display includes a plurality of pixels such as red pixels, blue pixels, green pixels, and white pixels, and may express full colors by combining the pixels. Each pixel includes an organic light emitting element, and a plurality of thin film transistors for driving the organic light emitting element.

The light emitting element of the organic light emitting diode (OLED) display includes a pixel electrode, an opposed electrode, and a light emitting layer arranged between the two electrodes. One of the pixel electrode and the opposed electrode becomes an anode, and the other electrode becomes a cathode. An electron injected from the cathode and a hole injected from the anode are coupled with each other in the light emitting layer to form an exciton, and the exciton emits light while discharging energy. The opposed electrode is formed throughout a plurality of pixels to transfer a predetermined common voltage.

In general, an insulating layer is arranged on a plurality of thin film transistors, and a conductive layer including the pixel electrode or other signal electrode is arranged on the insulating layer. The insulating layer includes a via hole, and the conductive layer on the insulating layer and the conductive layer such as the electrode of the thin film transistor under the insulating layer may be electrically connected to each other through the via hole of the insulating layer.

To improve a characteristic of the display panel, when forming the thick insulating layer on the thin film transistor, a step of the via hole of the insulating layer may be high. Since the via hole has a concave shape having the high step, if another layer is arranged on the via hole, the concave shape of the via hole is transferred to that layer such that diffused reflection of external light may be generated at the concave portion. This may be recognized as a stain on the outside. Particularly, when the thickness of the layer arranged on the via hole is thick, the step of the transferred concave shape is increased such that the display defect due to the stain may be serious.

The above information disclosed in this Background section is only for enhancement of understanding of the background of the invention and therefore it may contain information that does not constitute prior art as per 35 U.S.C. 102.

SUMMARY OF THE INVENTION

Accordingly, the present invention provides a display panel preventing a display defect such as a stain-like spot by reducing the diffused reflection of the external light due to the via hole, and a display device including the same.

According to one aspect of the present invention, there is provided a display device that includes a semiconductor element including a first electrode, a passivation layer arranged on the semiconductor element and including a via hole exposing the first electrode, a second electrode arranged on the passivation layer and connected to the first electrode through the via hole and a spacer arranged on the second electrode and adjacent to the via hole, wherein the spacer exposes at least a portion of a region where the via hole is arranged.

The spacer may include a first edge side surface overlapping the region where the via hole is arranged. The display device may also include a pixel definition layer arranged on the second electrode and including a first opening exposing the second electrode. The pixel definition layer may cover the via hole. The spacer may be arranged on the pixel definition layer. The pixel definition layer may also include a second opening arranged adjacent to the via hole. The spacer and the pixel definition layer may be made out of a same material. The first edge side surface of the spacer may overlap a plurality of the via holes. The display device may also include a third electrode arranged on the pixel definition layer and the spacer.

The display device may also include a pixel definition layer arranged on the second electrode, covering the via hole, and including a same material as the spacer, the first edge side surface to prevent external light from being diffused and distorted by a concave shape of the second electrode arranged within the via hole.

The spacer may include an optically transparent and electrically insulating material. The semiconductor element may be arranged on a substrate, the first edge side surface of the spacer may form an angle with a surface of the substrate that is larger than about 10 degrees and is less than 90 degrees. The first edge side surface may be spaced apart from the via hole by a distance less than a width of the via hole. The first edge side surface may overlap the via hole to prevent the via hole from producing optical distortions and stains from external light by preventing a concave shape of the via hole from transferring and being present on an outer surface of the display device and preventing the external light from being diffused and reflected by the concave shape of the via hole.

The second opening may be adjacent to the via hole to prevent the via hole from producing optical distortions and stains from external light and prevent a concave shape of the via hole from transferring and being present on an outer surface of the display device and prevent the external light from being diffused and reflected by the concave shape of the via hole. A combination of the second opening being adjacent to the via hole and the first edge side surface overlapping the via hole may prevent the via hole from producing optical distortions and stains from external light by preventing a concave shape of the via hole from transferring and being present on an outer surface of the display device and preventing the external light from being diffused and reflected by the concave shape of the via hole.

The spacer being may be comprised of one of photoresist, polyacrylate-based resin, polyimide-based resin, acryl-based resin, silicon dioxide and silicon nitride. The spacer and the pixel defining layer may each include a same material that is one of photoresist, polyacrylate-based resin, polyimide-based resin, acryl-based resin, silicon dioxide and silicon nitride. The spacer being essentially a portion of the pixel defining layer having a second and larger thickness than a remaining portion of the pixel defining layer external to the first opening and may have a first and lesser thickness, the first edge side surface may be a transition region between the portion of the pixel defining layer having the second thickness and the portion of the pixel defining layer having the first thickness. The spacer may be a portion of the pixel defining layer having a second and greater thickness than a remaining portion of the pixel defining layer external to the first opening having a first and lesser thickness.

According to another aspect of the present invention, there is provided a display device including an insulating substrate, a semiconductor element arranged on the substrate, a first electrode arranged on the semiconductor element, a passivation layer arranged on the semiconductor element and being perforated by a via hole exposing the first electrode, a second electrode arranged on the passivation layer and connected to the first electrode through the via hole and a pixel defining layer arranged on the second electrode and on the passivation layer, the pixel defining layer being perforated by a first opening exposing a portion of the second electrode, the pixel defining layer having a first portion external to the first opening, having a first thickness and corresponding to at least a portion of the via hole, the pixel defining layer also including a spacer portion having a second and greater thickness and a first edge side surface connecting the first and second portions.

The pixel defining layer may include one of photoresist, polyacrylate-based resin, polyimide-based resin, acryl-based resin, silicon dioxide and silicon nitride, the first edge side surface forming an angle with a surface of the substrate that is larger than about 10 degrees and is less than 90 degrees. The second electrode may be arranged within the via hole and may form a concave surface with respect to a front surface of the display device, the first edge side surface of the pixel defining layer may prevent external light from being distorted by the second electrode within the via hole and prevent external light from reflecting off of the concave surface of the second electrode within the via hole.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
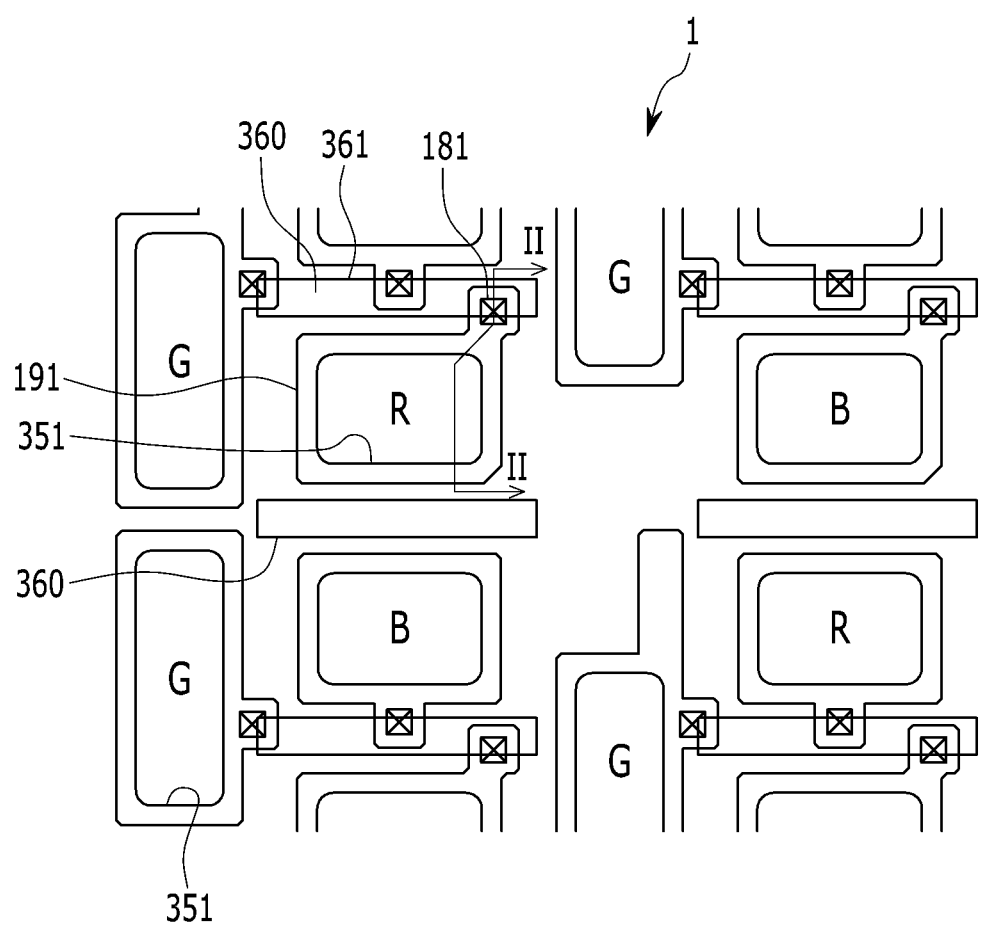
FIG. 1 is a layout view of a display panel according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to clarify the present invention, parts that are not connected with the description will be omitted, and the same elements or equivalents are referred to by the same reference numerals throughout the specification.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements. Further, in the specification, the word "~on" means positioning above or below the object portion, but does not essentially mean positioning on the upper side of the object portion based on a gravity direction.

Figure 2:
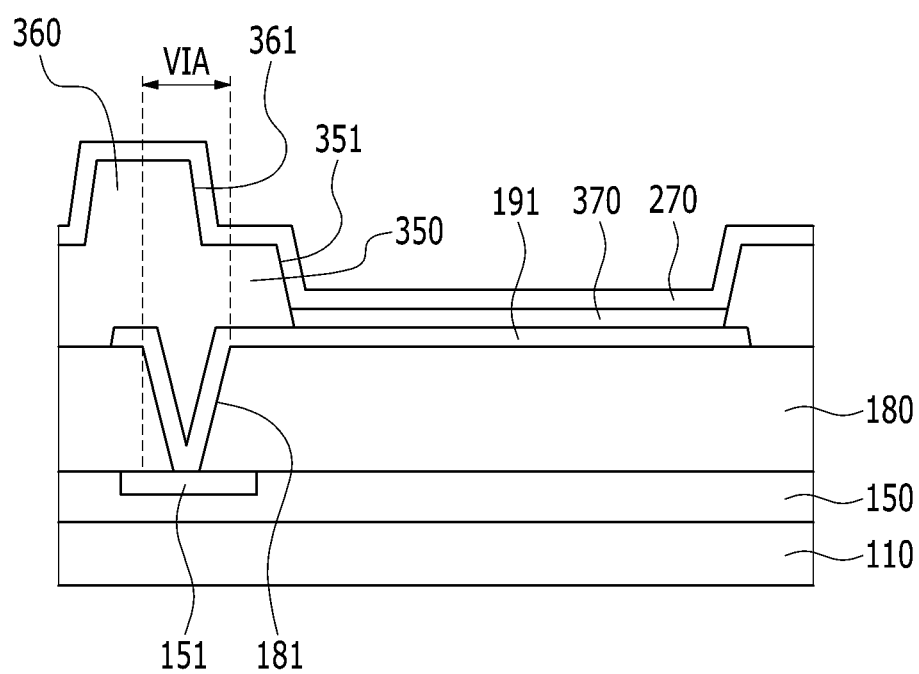
FIG. 2 is cross-sectional view of the display panel of FIG. 1 taken along the line II-II.

Now, a display device of a display panel according to an exemplary embodiment of the present invention will be described with reference to FIGS. 1 and 2. FIG. 1 is a layout view of a display panel according to an exemplary embodiment of the present invention, and FIG. 2 is cross-sectional view of the display panel of FIG. 1 taken along the line II-II. Referring to FIG. 1, an organic light emitting device according to an exemplary embodiment of the present invention includes a display panel 1 including a plurality of pixels.

One pixel may display an image of a luminance according to an input image signal. Each pixel includes a semiconductor element (not shown) connected to a signal line and an organic light emitting element connected thereto.

Referring to FIG. 2, the semiconductor element may be arranged at a semiconductor element layer 150 arranged on an insulation substrate 110 such as glass or plastic. The semiconductor element may include at least one transistor (FET)

outputting a current or a voltage through an electrode 151. The transistor may be an electric field effect transistor (FET).

The organic light emitting element is, for example, an organic light emitting diode, and includes a pixel electrode 191 connected to the semiconductor element, an opposed electrode 270 receiving a common voltage, and an emission layer 370 provided between the pixel electrode 191 and the opposed electrode 270. The pixel electrode 191 may function as an anode and the opposed electrode 270 may function as a cathode, or the pixel electrode 191 may function as a cathode and the opposed electrode 270 may function as an anode.

The organic light emitting element emits light with different intensities according to an output current of the semiconductor element to display the image. The emission layer 370 of the organic light emitting element may include an organic material emitting unique light of one or more colors among a plurality of primary colors such as three primary colors of red R, green G, and blue B, four primary colors, and the like, or may include an organic material emitting white light. The organic light emitting device may display a desired image by a spatial sum of the colors. FIG. 1 is an example that each pixel includes an emission layer 370 uniquely emitting the light of red R, green G, and blue B. Hereafter, the pixel emitting red R is referred to as a red pixel R, the pixel emitting green G is referred to as a green pixel G, and the pixel emitting blue B is referred to as a blue pixel B.

Referring to FIG. 2, at least one passivation layer 180 may be arranged on the semiconductor element layer 150, and a pixel electrode 191 may be arranged thereon. The passivation layer 180 may include at least one of an inorganic material such as a silicon nitride, a silicon oxide, or an organic material. The organic material may be, for example, an acrylate polymer, a polyimide polymer, a polyamide polymer, a siloxane polymer, a polymer including a photosensitive acryl carboxylic group, a novolac-based resin, an alkali soluble resin, and the like.

The passivation layer 180 includes a via hole 181 exposing an electrode 151 of the semiconductor element, and the pixel electrode 191 is connected to the electrode 151 of the semiconductor element through the via hole 181, thereby receiving the current or the voltage.

Referring to FIG. 1, the pixel electrode 191 of each pixel is protruded toward a space between the pixels, thereby being connected to the electrode 151 of the semiconductor element through the via hole 181.

The pixel electrode 191 may include a light reflective material. For example, the pixel electrode 191 may include at least one of a metal such as aluminum, silver, tungsten, gold, chromium, tungsten, molybdenum, titanium, palladium, iridium, and the like, or an alloy thereof, and may include a single layer or a stacked layer containing the same.

A pixel definition layer 350 and a spacer 360 are arranged on the pixel electrode 191. The pixel definition layer 350 includes an opening 351 exposing the pixel electrode 191 of each pixel. The opening 351 of the pixel definition layer 350 may define a pixel area that is an emitting region of each pixel.

An encapsulating member (not shown) for encapsulating of the display panel 1 may be further arranged on the spacer 360, and the spacer 360 may maintain an interval of space between the organic light emitting element and the encapsulating member, thereby protecting the organic light emitting element. However, a function of the spacer 360 is not limited thereto as other functions may exist. For example, the spacer 360 may be formed for preventing the diffused reflection near the via hole 181.

Referring to FIG. 1, the spacer 360 is arranged between the pixel areas and does not overlap the emission layer 370 of each pixel. For example, the spacer 360 may be arranged between the red pixel R, the green pixel G, and the blue pixel B. Referring to FIG. 1, in a case of the exemplary embodiment in which the green pixel G is continuously disposed in a line, the spacer 360 may be arranged between the red pixel R and the blue pixel B. In this case, the spacer 360 may be disposed in all the space between the red pixel R and the blue pixel B, or may be disposed with a smaller density than this.

The spacer 360 adjacent to the via hole 181 may include an edge side surface 361 overlapping all the via hole regions VIA where each via hole 181 of the red pixel R, the green pixel G, and the blue pixel B adjacent to each other are arranged, or a portion of the via hole regions VIA.

Referring to FIG. 2, the spacer 360 is arranged on the pixel definition layer 350 such that an upper surface thereof is higher than the upper surface of the pixel definition layer 350. The spacer 360 includes the edge side surface 361 that is connected to the upper surface and is not parallel to a surface of the substrate 110. For example, the edge side surface 361 of the spacer 360 may form an angle that is larger than about 10 degrees to less than 90 degrees with respect to the surface of the substrate 110. The upper surface of the spacer 360 forms the step with reference to the edge side surface 361.

According to an exemplary embodiment of the present invention, the spacer 360 arranged to be adjacent to the via hole 181 does not completely cover the via hole 181, and the edge side surface 361 of the spacer 360 arranged to be adjacent to the via hole 181 is arranged within the via hole region VIA that is a region on or above the region where the via hole 181 of the passivation layer 180 is formed. That is, the edge side surface 361 of the spacer 360 arranged to be adjacent to the via hole 181 may overlap the region where the via hole 181 of the passivation layer 180 is formed, that is, the via hole region VIA. In other words, the edge side surface 361 of the spacer 360 may be arranged within the via hole region VIA including a boundary of the via hole region VIA.

Accordingly, the concave shape of the via hole 181 is not transferred to the upper surface of the spacer 360 because the concave shape is not generated at the upper surface of the spacer 360. Accordingly, external light incident from the outside of the display panel 1 may be prevented from being diffused-reflected at the upper surface of the spacer 360 of the via hole 181, and thereby stain-like spots due to the diffused reflection may be prevented from being generated.

In other embodiments to be discussed later (see FIGS. 5 and 14), the edge side surface 361 of the spacer 360 adjacent to the via hole 181 may instead be arranged outside the via hole region VIA. In this case, a distance (see d1 in FIG. 14) between the edge side surface 361 of the spacer 360 and an edge boundary of the via hole region VIA may be determined as an appropriate distance at which the diffused reflection of the external light may not be generated. For example, the distance d1 between the edge side surface 361 of the spacer 360 and the edge boundary of the via hole region VIA may be less than about a diameter or width of the via hole region VIA, but is not limited thereto.

The spacer 360 may include the same material as the pixel definition layer 350, and in this case, the pixel definition layer 350 and the spacer 360 may be simultaneously formed by using one photomask. In this manufacturing process, the used photomask may include a semitransparent portion that is a halftone region to control transmittance of the light depending on a location. For example, a location where the spacer 360 is formed may correspond to a light transmittance portion or a light shielding portion of the photomask, and a position where the pixel definition layer 350 is formed may correspond to a semitransparent portion of the photomask.

In other embodiment to be discussed later (see FIG. 12), the spacer 360 may include a material different from the pixel definition layer 350, and in this case, the pixel definition layer 350 and the spacer 360 may be formed through different photo-processes.

At least one of the pixel definition layer 350 and the spacer 360 may include at least one organic material, such as a photoresist, a polyacrylate-based resin, a polyimide-based resin, and an acryl-based resin, or an inorganic material such as a silicon oxide or a silicon nitride.

Again referring to FIG. 1, the red pixel R, the green pixel G, and the blue pixel B in the display device according to an exemplary embodiment of the present invention may be regularly arranged.

For example, the red pixel R and the blue pixel B are alternately arranged in a vertical direction, and the green pixel G may be arranged at one side of the red pixel R and the blue pixel B. A length of a horizontal direction of the green pixel G is shorter than the length of the horizontal direction of the red pixel R or the blue pixel B, and a length of the vertical direction of the green pixel G may be longer than the length of the vertical direction of either of the red pixel R or the blue pixel B. Here, the length of the pixel may be the length of the region where the emission layer 370 is deposited, that is, the pixel area.

The green pixel G may be continuously arranged in the vertical direction. A column of the green pixel G and a column where the red pixel R and the blue pixel B are arranged may be alternately arranged. A size of the red pixel R and the blue pixel B may be substantially the same or different, as shown in FIG. 1, however, the arrangement and the size of the pixel representing each primary color is not limited thereto, and may be variously changed.

The opposed electrode 270 is arranged on the pixel definition layer 350, the spacer 360, and the emission layer 370. The opposed electrode 270 may be deposited on the entire surface. The opposed electrode 270 may include a reflective material that can reflect light or a transparent conductive material. The opposed electrode 270 may include at least one metal, such as aluminum, silver, tungsten, gold, chromium, tungsten, molybdenum, titanium, palladium, iridium, and the like, or an alloy thereof, and may include a single layer or a stacked layer containing the same.

Next, the display device including the display panel according to an exemplary embodiment of the present invention will be described with reference to FIGS. 3 4 along with the previously described drawings. The same reference numerals will be used to refer to the same constituent elements throughout the exemplary embodiments, and detailed descriptions of the same elements will be omitted in order to avoid redundancy.

Figure 3:
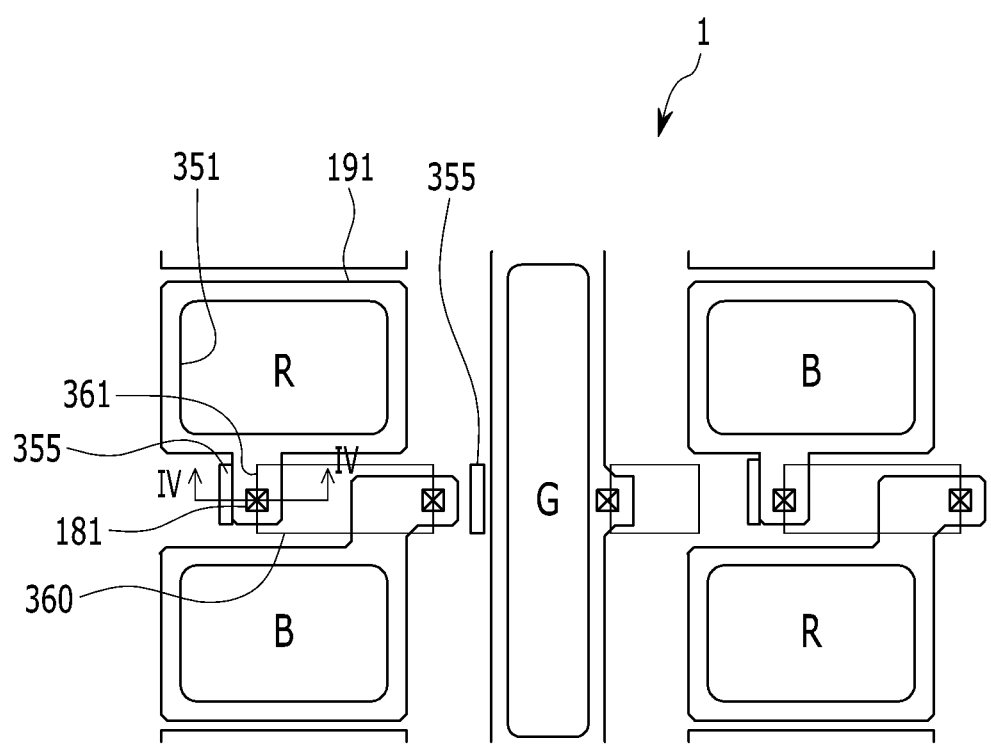
FIG. 3 is a layout view of a display panel according to an exemplary embodiment of the present invention.
Figure 4:
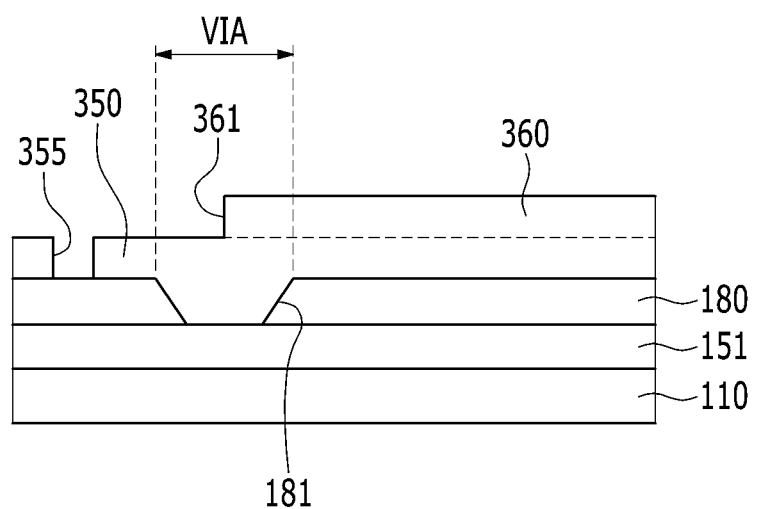
FIG. 4 is a cross-sectional view of the display panel of FIG. 3 taken along the line IV-IV.

Turning to FIGS. 3 and 4, FIG. 3 is a layout view of a display panel according to an exemplary embodiment of the present invention and FIG. 4 is a cross-sectional view of the display panel of FIG. 3 taken along line IV-IV. Referring to FIG. 3 and FIG. 4, the display panel 1 included in the display device according to an exemplary embodiment of the present invention is the same as most of the display panel 1 according to the exemplary embodiment shown in FIGS. 1 and 2, however the pixel definition layer 350 may further include an opening 355 arranged near the via hole 181.

Referring to FIG. 3 and FIG. 4, as described above, the passivation layer 180 includes the via hole 181 exposing the electrode 151 of the semiconductor element, and the edge side surface 361 of the spacer 360 may be arranged within the via hole region VIA, that is the region on or under the region where the via hole 181 is formed.

The pixel definition layer 350 may include the opening 355 arranged near the via hole region VIA. The opening 355 does not overlap the opening 351. The opening 355 may face the adjacent spacer 360 via at least a portion of the via hole 181.

The width of the opening 355 may be equal to or less than the width of the adjacent via hole 181. The opening 355 may have a function of reducing the diffused reflection due to the via hole 181.

The opening 355 may be arranged outside the via hole region VIA. In this case, the distance between the opening 355 and the edge boundary of the via hole region VIA may be about one time to about 10 times the width of the via hole region VIA, however it is not limited thereto, and may be controlled as an appropriate distance that may reduce the diffused reflection due to the via hole 181.

Differently from this, the opening 355 may be arranged within the via hole region VIA including the edge boundary of the via hole region VIA.

According to another exemplary embodiment of the present invention, the pixel definition layer 350 is not completely removed from the opening 355 and may remain as the layer having the thinner thickness than the surrounding pixel definition layer 350.

Referring to FIG. 3, the opening 355 of the pixel definition layer 350 may be arranged in the space between the adjacent pixels. As shown in FIG. 3, when the spacer 360 includes two or more edge side surfaces 361 overlapping two or more via holes 181, two or more openings 355 may be formed near the via hole region VIA while being adjacent to the spacer 360, or only one opening 355 may be formed.

Figure 5:
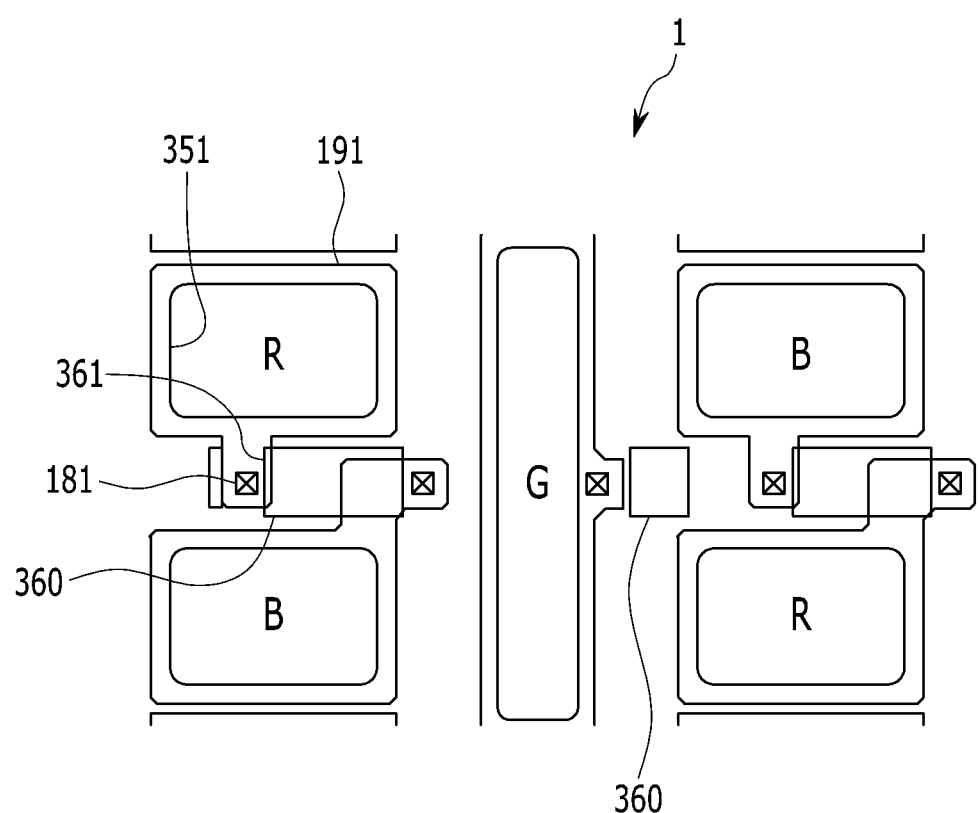
FIG. 5, FIG. 6, and FIG. 7 are layout views of a display panel according to an exemplary embodiment of the present invention.
Figure 6:
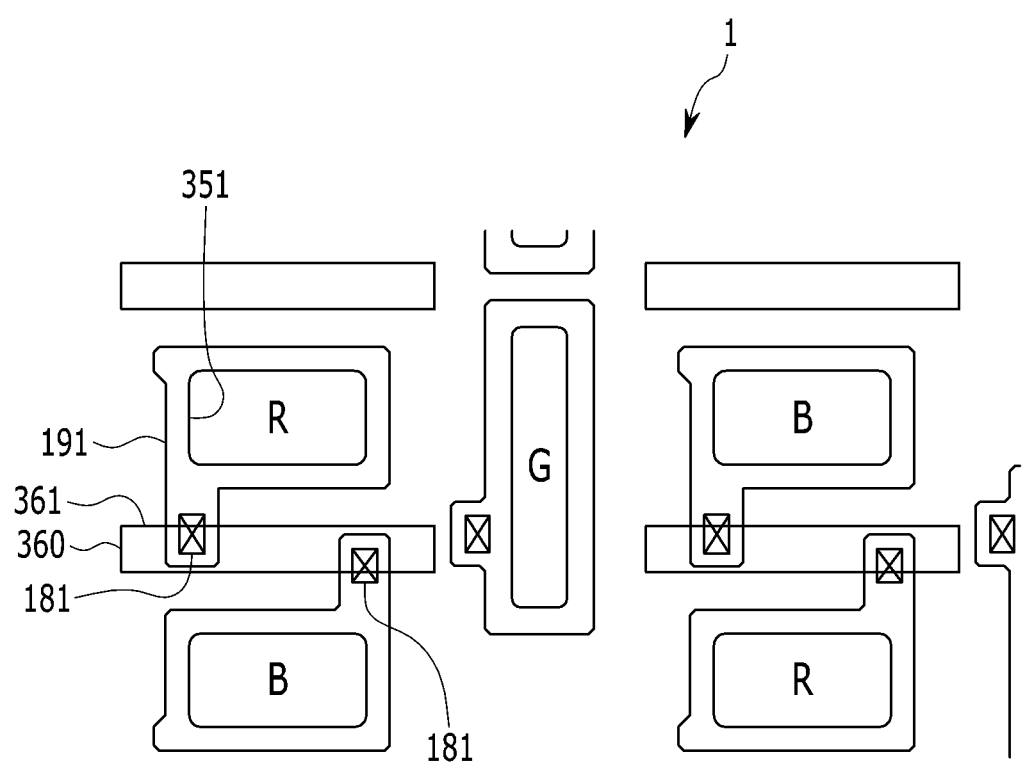
Figure 7:
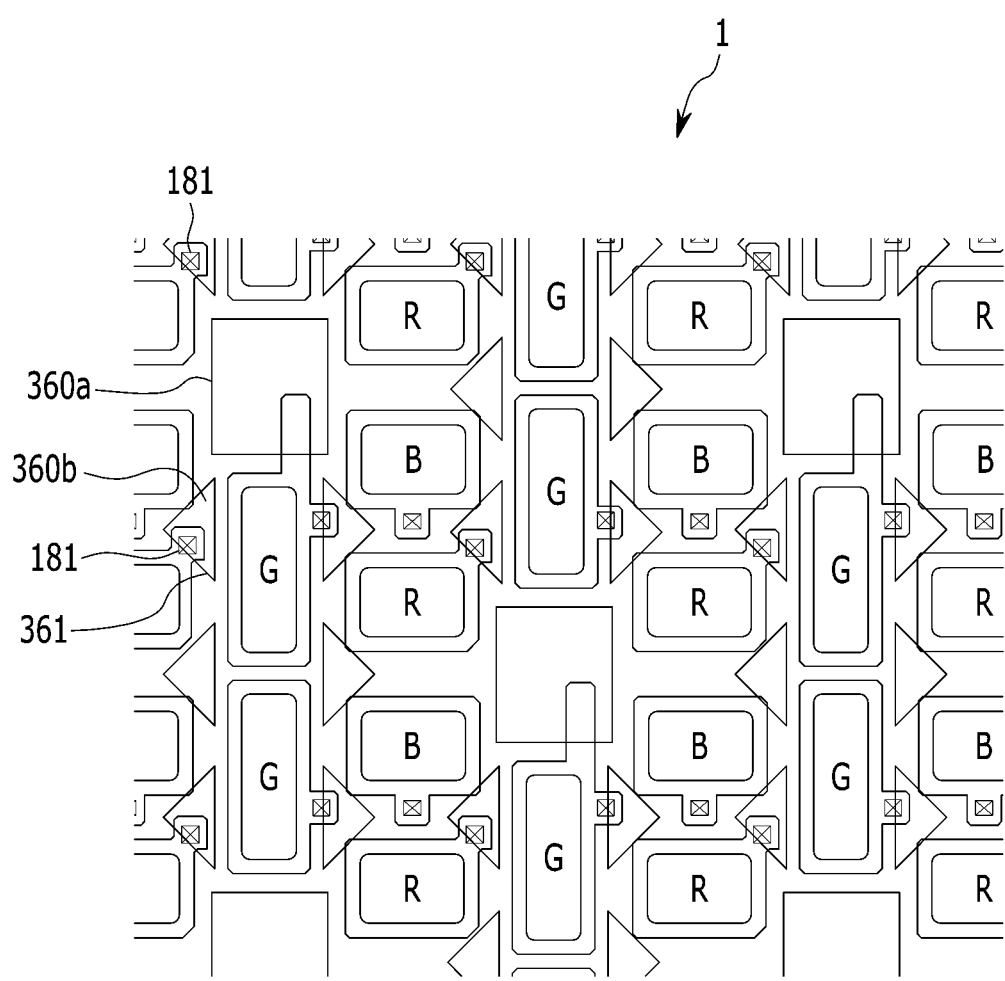

Next, the display device including the display panel according to an exemplary embodiment of the present invention will be described with reference to FIGS. 5-7 along with the described drawings. Turning now to FIGS. 5-7, FIGS. 5-7 are layout views of a display panel according to an exemplary embodiment of the present invention, respectively.

Referring to FIG. 5, the display panel 1 included in the display device according to an exemplary embodiment of the present invention is the same as most of the display panel 1 according to the exemplary embodiment shown in FIGS. 1 and 2, however the edge side surface 361 of the spacer 360 adjacent to the via hole 181 is arranged outside the region where the via hole 181 is formed, that is, outside the described via hole region VIA. In this case, as described above, the distance between the edge side surface 361 of the spacer 360 and the edge boundary of the via hole region VIA may be determined as an appropriate distance at which the diffused reflection of the external light may not be generated. For example, the distance between the edge side surface 361 of the spacer 360 and the edge boundary of the via hole region VIA may be equal to the width of the via hole region VIA, but is not limited thereto.

Referring to FIG. 6, the display panel 1 included in the display device according to an exemplary embodiment of the present invention is the same as most of the display panel 1 according to the exemplary embodiment shown in FIGS. 1 and 2, however the spacer 360 adjacent to the via hole 181 includes the edge side surface 361 overlapping all of the via hole region VIA where each via hole 181 of the red pixel R and the blue pixel B adjacent to each other is formed. The edge side surface 361 of the spacer 360 may not overlap the via hole region VIA where the via hole 181 of the green pixel G is formed. Furthermore, the edge side surface 361 of the spacer 360 may not overlap and may be separated from the region where the pixel electrode 191 of the green pixel G is formed.

In the exemplary embodiment shown in FIG. 6, like the exemplary embodiment shown in FIGS. 3 and 4, the pixel definition layer 350 may include an opening (not shown). In this case, the opening of the pixel definition layer 350 may be arranged to be adjacent to a short side ends of the spacer 360, and the opening of the pixel definition layer 350 arranged at the position near the green pixel G may not overlap the via hole 181 of the green pixel G.

Referring to FIG. 7, the display panel 1 included in the display device according to an exemplary embodiment of the present invention is the same as most of the display panel 1 according to the exemplary embodiment shown in FIGS. 1 and 2, however the shape and the arrangement of the red pixel R, the green pixel G, and the blue pixel B and the shape and arrangement of the spacer 360 may be different.

For example, a first spacer 360a may be disposed between the green pixels G that are arranged in one line. The first spacer 360a may be disposed for two green pixels G as shown, however it is not limited thereto. The first spacer 360a may be disposed for three or more green pixels G, and the first spacer 360a may be disposed between all the green pixels G. The shape of the first spacer 360a disposed between the green pixels G may be a quadrangle, but is not limited thereto.

In contrast, differently from the previous exemplary embodiments, the spacer may not be disposed in the column where the red pixel R and the blue pixel B are arranged. Alternatively, a second spacer 360b may be cyclically disposed between the column where the green pixels G are arranged and the column where the red pixel R and the blue pixel B are arranged. The shape of the second spacer 360b may be a triangle, but is not limited thereto. When the shape of the second spacer 360b is the triangle, one apex of the triangle may be arranged at the space between the red pixel R and the blue pixel B adjacent to each other.

The size of the first spacer 360a may be larger than the size of the second spacer 360b, and a number of the first spacers 360a arranged at the unit region may be smaller than a number of the second spacers 360b.

The first spacer 360a may not overlap the region where the via hole 181 is arranged.

The second spacer 360b may include the edge side surface 361 overlapping the region where the via hole 181 is formed, that is, the via hole region VIA. The via hole 181 overlapping the edge side surface 361 of the second spacer 360b may be the via hole 181 of the green pixel G or the via hole 181 of the red pixel R, however it is not limited thereto, and it may overlap the via hole 181 of the blue pixel B.

Figure 8:
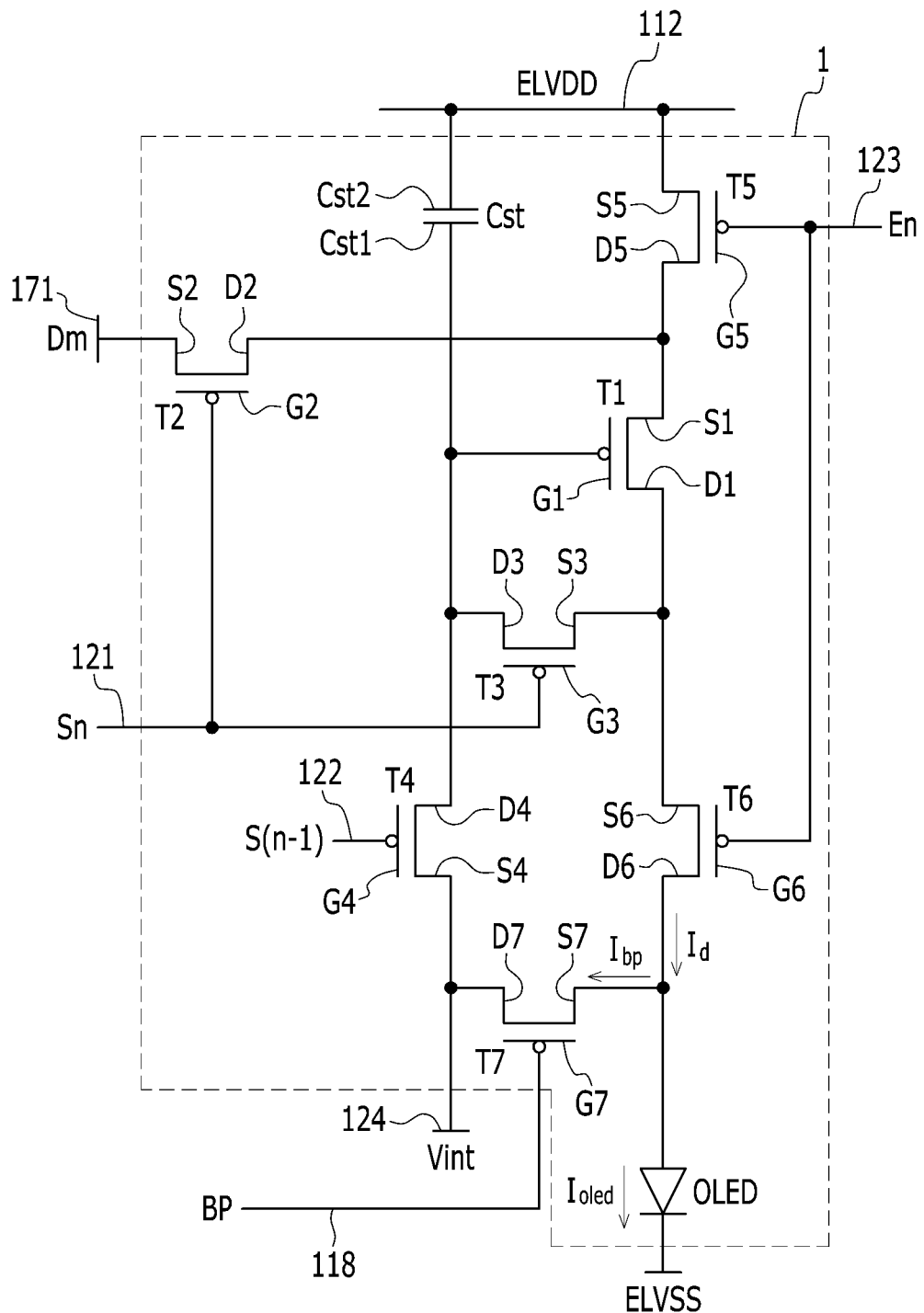
FIG. 8 is an equivalent circuit diagram of one pixel of a display device according to an exemplary embodiment of the present invention.

Next, the display device according to an exemplary embodiment of the present invention will be described with reference to FIG. 8. Turning now to FIG. 8, FIG. 8 is an equivalent circuit diagram of one pixel of a display device according to an exemplary embodiment of the present invention.

As shown in FIG. 8, the display device according to an exemplary embodiment of the present invention may be an organic light emitting device. One pixel 1 includes a plurality of signal lines 121, 122, 123, 124, 118, 171, and 112, a plurality of transistors T1, T2, T3, T4, T5, T6, and T7 connected to a plurality of signal lines, a storage capacitor Cst, and an organic light emitting diode (OLED).

The transistor may include a driving transistor (driving thin film transistor) T1, a switching transistor (switching thin film transistor) T2, a compensation transistor T3, an initialization transistor T4, an operation control transistor T5, a light emission control transistor T6, and a bypass transistor T7.

The signal lines may include a scan line 121 for transmitting a scan signal Sn, a previous scan line 122 for transmitting a previous scan signal S(n−1) to the initialization transistor T4, a light emission control line 123 for transmitting a light emission control signal En to the operation control transistor T5 and the light emission control transistor T6, an initialization voltage line 124 for transmitting an initialization voltage Vint for initializing the driving transistor T1, a bypass control line 118 for transmitting a bypass signal BP to the bypass thin film transistor T7, a data line 171 crossing the scan line 121 to transmit a data signal Dm, and a driving voltage line 112 crossing the data line 171 to transmit a driving voltage ELVDD.

A gate electrode G1 of the driving transistor T1 is connected to one end Cst1 of the storage capacitor Cst, a source electrode S1 of the driving transistor T1 is connected to the driving voltage line 112 via the operation control transistor T5, and the drain electrode D1 of the driving transistor T1 is electrically connected to an anode of the organic light emitting diode OLED via the light emission control transistor T6. The driving transistor T1 receives the data signal Dm according to a switching operation of the switching transistor T2 to supply a driving current Id to the organic light emitting diode OLED.

A gate electrode G2 of the switching transistor T2 is connected to the scan line 121, a source electrode S2 of the switching transistor T2 is connected to the data line 171, and a drain electrode D2 of the switching transistor T2 is connected to the driving voltage line 112 via the operation control transistor T5 while being connected to the source electrode S1 of the driving transistor T1. The switching transistor T2 may be turned on according to the scan signal Sn received through the scan line 121 to perform the switching operation for transmitting the data signal Dm transmitted to the data line 171 to the source electrode of the driving transistor T1.

A gate electrode G3 of the compensation transistor T3 is directly connected to the scan line 121, a source electrode S3 of the compensation transistor T3 is connected to an anode of the organic light emitting diode OLED via the light emission control transistor T6 while being connected to the drain electrode D1 of the driving transistor T1, and a drain electrode D3 of the compensation transistor T3 is connected to all of one end Cst1 of the storage capacitor Cst, a drain electrode D4 of the initialization transistor T4, and the gate electrode G1 of the driving transistor T1. The compensation transistor T3 is turned on according to the scan signal Sn received through the scan line 121 to diode-connect the driving transistor T1 by connecting the gate electrode G1 and the drain electrode D1 of the driving transistor T1 to each other.

A gate electrode G4 of the initialization transistor T4 is connected to the previous scan line 122, the source electrode S4 of the initialization transistor T4 is connected to the initialization voltage line 124, and the drain electrode D4 of the initialization transistor T4 is connected to all of the one end Cst1 of the storage capacitor Cst, the drain electrode D3 of the compensation transistor T3, and the gate electrode G1 of the driving transistor T1 together. The initialization transistor T4 is turned on according to the previous scan signal S(n−1) received through the previous scan line 122 to transmit the initialization voltage Vint to the gate electrode G1 of the driving transistor T1, and perform an initialization operation of initializing the voltage of the gate electrode G1 of the driving transistor T1.

A gate electrode G5 of the operation control transistor T5 is connected to the light emission control line 123, a source electrode S5 of the operation control transistor T5 is connected to the driving voltage line 112, and a drain electrode D5 of the operation control transistor T5 is connected to the source electrode S1 of the driving transistor T1 and the drain electrode S2 of the switching transistor T2.

A gate electrode G6 of the light emission control transistor T6 is connected to the light emission control line 123, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the organic light emitting diode (OLED). The operation control transistor T5 and the light emission control transistor T6 are simultaneously turned on according to the light emission control signal En received through the light emission control line 123, so that the driving voltage ELVDD is transmitted to the organic light emitting diode OLED, and thus the driving current Id flows in the organic light emitting diode OLED.

A gate electrode G7 of the bypass thin film transistor T7 is connected to the bypass control line 118, a source electrode S7 of the bypass thin film transistor T7 is connected to both the drain electrode D6 of the light emission control thin film transistor T6 and the anode of the organic light emitting diode OLED together, and a drain electrode D7 of the bypass thin film transistor T7 is connected to both the initialization voltage line 124 and the source electrode S4 of the initialization thin film transistor T4.

The other end Cst2 of the storage capacitor Cst is connected to the driving voltage line 112, and a cathode of the organic light emitting diode OLED is connected to a common voltage ELVSS. Accordingly, the organic light emitting diode OLED displays an image by receiving the driving current Ioled from the driving transistor T1 to emit light.

Next, an example of the operation of one pixel of the organic light emitting device according to an exemplary embodiment of the present invention will be described.

First, for an initializing period, the previous scan signal S(n−1) having a low level is supplied through the previous scan line 122. Then, the initializing thin film transistor T4 is turned on in response to the previous scan signal S(n−1) having the low level, the initial voltage Vint is connected to the gate electrode of the driving transistor T1 from the initialization voltage line 124 through the initializing thin film transistor T4, and then the driving thin film transistor T1 is initialized by the initialization voltage Vint.

Thereafter, for a data programming period, the scan signal Sn having a low level is supplied through the scan line 121. Then, the switching thin film transistor T2 and the compensating thin film transistor T3 are turned on in response to the scan signal Sn having the low level. At this time, the driving transistor T1 is diode-connected through the turned-on compensation transistor T3 and is biased in a forward direction.

Then, a compensation voltage Dm+Vth (Vth is a negative (−) value) reduced by a threshold voltage Vth of the driving thin film transistor T1 from a data signal Dm supplied from the data line 171 is applied to the gate electrode G1 of the driving thin film transistor T1. The driving voltage ELVDD and the compensation voltage (Dm+Vth) are applied to opposing terminals respectively of the storage capacitor Cst, and a charge corresponding to a voltage difference between the opposing terminals is stored in the storage capacitor Cst. Thereafter, for an emission period, the emission control signal En supplied from the emission control line 123 is changed from the high level to the low level. Then, the operation control transistor T5 and the emission control transistor T6 are turned on by the emission control signal En of the low level for the emission period.

Then, a driving current Id is generated according to a voltage difference between the voltage of the gate electrode of the driving thin film transistor T1 and the driving voltage ELVDD, and the driving current Id is supplied to the organic light emitting diode OLED through the emission control transistor T6. The gate-source voltage Vgs of the driving thin film transistor T1 is maintained as "(Dm+Vth)−ELVDD" by the storage capacitor Cst for the emission period, and according to a current-voltage relationship of the driving thin film transistor T1, the driving current Id is proportional to the square "$(Dm-ELVDD)^2$" of a value obtained by subtracting the threshold voltage from the source-gate voltage. Accordingly, the driving current Id is determined regardless of the threshold voltage Vth of the driving thin film transistor T1.

In this case, the bypass transistor T7 receives a bypass signal BP from the bypass control line 118. The bypass signal BP is a voltage having a predetermined level which always turns off the bypass transistor T7, the bypass transistor T7 receives a voltage having a transistor off level at the gate electrode G7, and thus the bypass transistor T7 is always turned off, and a part of the driving current Id flows out through the bypass transistor T7 as a bypass current Ibp.

Accordingly, when the driving current displaying a black image flows, the emission current Ioled of the organic light emitting diode which is reduced by the current amount of the bypass current Ibp which flows out from the driving current Id through the bypass transistor T7 has a minimum current amount as a level which may exactly express the black image. Therefore, a black luminance image is exactly implemented by using the bypass transistor T7, thereby improving a contrast ratio.

Figure 9:
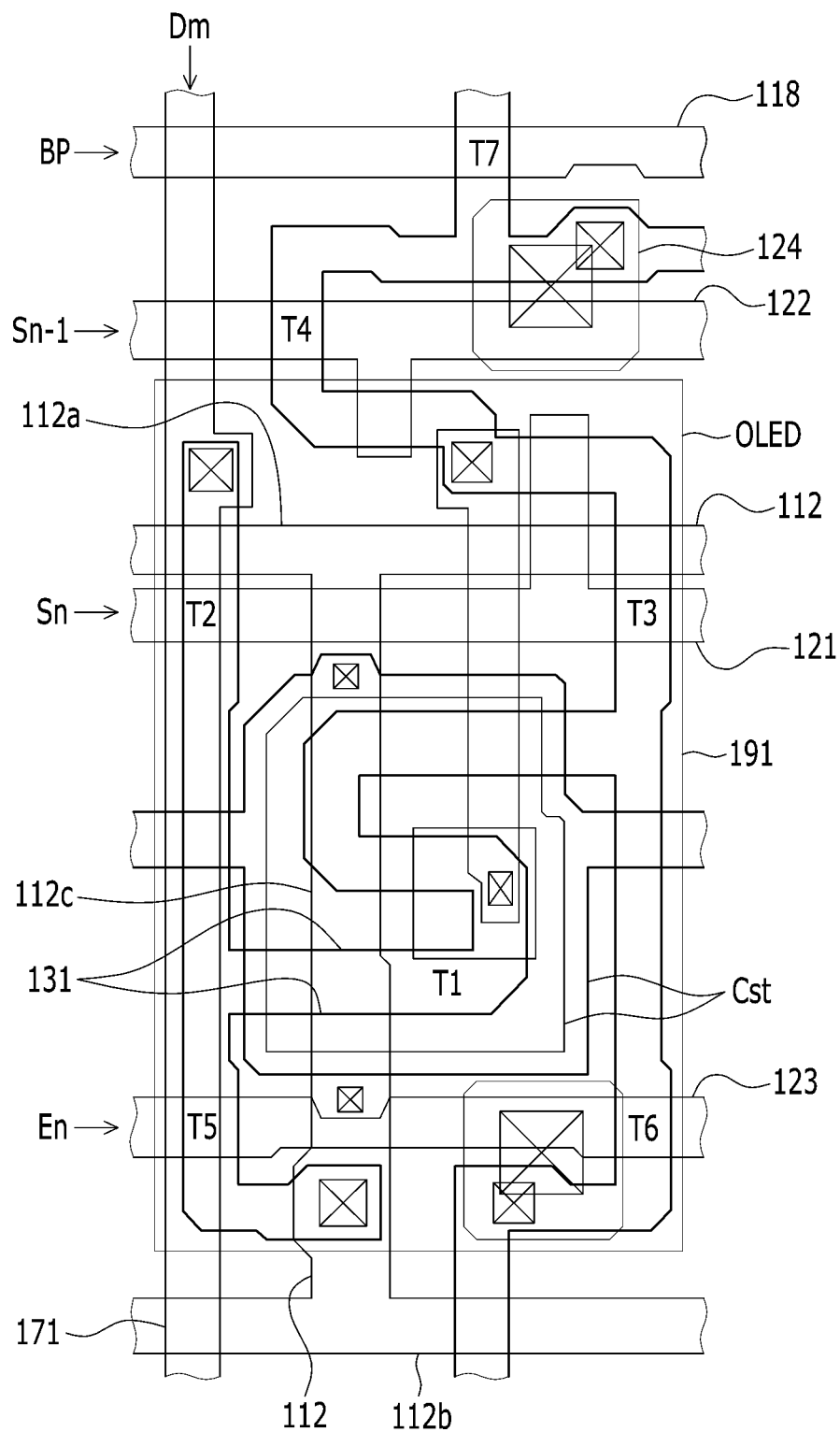
FIG. 9 is a layout view of one pixel of a display device according to an exemplary embodiment of the present invention.
Figure 10:
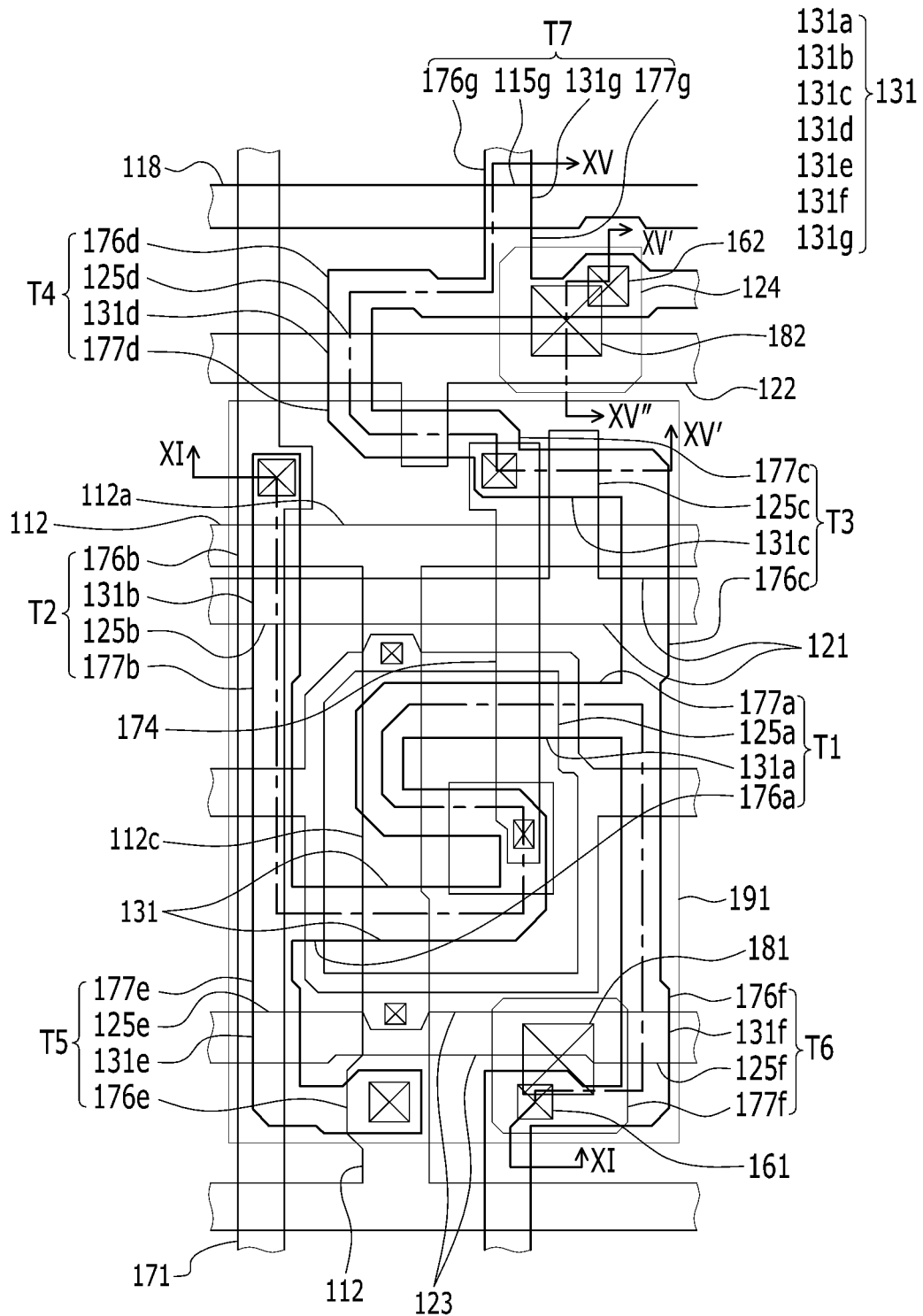
FIG. 10 is a layout view of a plurality of transistors and capacitors included in one pixel of the display device according to an exemplary embodiment of the present invention shown in FIG. 9.

Next, a detailed structure of the pixel of the organic light emitting diode display illustrated in FIG. 8 will be described in detail with reference to FIG. 9 and FIG. 10 in addition to FIG. 8. Turning now to FIGS. 9 and 10, FIG. 9 is a layout view of one pixel of a display device according to an exemplary embodiment of the present invention and FIG. 10 is a layout view of a plurality of transistors and capacitors included in one pixel of the display device according to an exemplary embodiment of the present invention shown in FIG. 9.

As illustrated in FIG. 9, the display device according to the exemplary embodiment of the present invention may include a scan line 121, a previous scan line 122, an emission control line 123, a bypass control line 118, and a driving voltage line 112, which apply a scan signal Sn, a previous scan signal S(n−1), an emission control signal En, a bypass signal BP, and a driving voltage ELVDD respectively and formed in a row direction, and includes a data line 171 which crosses the scan line 121, the previous scan line 122, the emission control line 123, the bypass control line 128, and the driving voltage line 112 and applies a data signal Dm.

The initialization voltage Vint is transferred to the driving thin film transistor T1 via the initialization transistor T4 from the organic light emitting diode OLED through the initialization voltage line 124. The driving voltage line 112 may cross the data line 171, and may be arranged at a different layer from the data line 171, the scan line 121, and the previous scan line 121. The driving voltage line 112 may include a first sub-control line 112a crossing one portion of the data line 171, a second sub-control line 112b crossing the other portion of the data line 171, and a connection line 112c connecting the first sub-control line 112a and the second sub-control line 112b.

The first sub-control line 112a, the connection line 112c, and the second sub-control line 112b may form a ladder shape in the row direction, and in this case, the voltage drop may be suppressed from being generated in the driving voltage ELVDD passing through the driving voltage line 112.

If the driving voltage line 112 and the bypass control line 118 are formed as a same layer and are simultaneously formed on a different layer than the scan line 121, the previous scan line 121 and the light emission control line 123 in the row direction, the interval between the signal lines adjacent in the row direction may be minimized. Accordingly, a larger number of pixels may be formed in a predetermined area, such that a high resolution organic light emitting device may be realized.

Although the interval between the signal lines adjacent in the row direction is minimized, if the driving voltage line 112 and the bypass control line 118 are formed as a same layer and are simultaneously formed on a different layer than the scan line 121, the previous scan line 121 and the light emission control line 123 in the row direction, a short-circuit between the neighboring signal lines may be minimized.

A driving transistor T1, a switching transistor T2, a compensation transistor T3, an initialization transistor T4, an operation control transistor T5, an emission control transistor T6, a bypass transistor T7, a storage capacitor Cst, and an organic light emitting diode (OLED) may be formed in the pixel 1. The driving thin film transistor T1, the switching thin film transistor T2, the compensation transistor T3, the initialization transistor T4, the operation control transistor T5, the emission control transistor T6, and the bypass transistor T7 may be formed along a semiconductor layer 131. The semiconductor layer 131 may be curved in various shapes.

The semiconductor layer 131 may be made of polysilicon or an oxide semiconductor. The oxide semiconductor may include one of oxides based on titanium (Ti), hafnium (Hf), zirconium (Zr), aluminum (Al), tantalum (Ta), germanium (Ge), zinc (Zn), gallium (Ga), tin (Sn), or indium (In), zinc oxide (ZnO), indium-gallium-zinc oxide (InGaZnO$_4$), indium zinc oxide (Zn—In—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), and hafnium-indium-zinc oxide (Hf—In—Zn—O) which are complex oxides thereof. In the case when the semiconductor layer 131 is made of the oxide semiconductor, in order to protect the oxide semiconductor that is vulnerable to an external environment such as a high temperature, a separate passivation layer may be added.

The semiconductor layer 131 may include a channel region in which a channel is doped with an N-type impurity or a P-type impurity, and a source region and a drain region which are formed at both sides of the channel region and are formed by doping an impurity which is opposite to the impurity doped in the channel region.

Hereinafter, a detailed planar structure of the display device according to the exemplary embodiment of the present invention will be first described in detail with reference to FIGS. 8 to 10. First, as illustrated in FIGS. 9 and 10, a pixel 1 of the display device according to the exemplary embodiment of the present invention may include the driving thin film transistor T1, the switching thin film transistor T2, the compensation transistor T3, the initialization transistor T4, the operation control transistor T5, the emission control transistor T6, the bypass transistor T7, the storage capacitor Cst, and the organic light emitting diode OLED. The transistors T1, T2, T3, T4, T5, T6, and T7 may be formed along the semiconductor layer 131, and the semiconductor layer 131 may include a driving semiconductor layer 131a formed in the driving thin film transistor T1, a switching semiconductor layer 131b formed in the switching thin film transistor T2, a compensation semiconductor layer 131c formed in the compensation transistor T3, an initialization semiconductor layer 131d formed in the initialization transistor T4, an operation control semiconductor layer 131e formed in the operation control transistor T5, an emission control semiconductor layer 131f formed in the emission control transistor T6, and a bypass semiconductor layer 131g formed in the bypass thin film transistor T7.

The driving thin film transistor T1 may include a driving semiconductor layer 131a, a driving gate electrode 125a, a driving source electrode 176a, and a driving drain electrode 177a. The driving semiconductor layer 131a may be curved and may have a zigzag shape. As such, the curved driving semiconductor layer 131a is formed, and thus the driving semiconductor layer 131a may be lengthily formed in a narrow space. Accordingly, since a driving channel region 131a1 of the driving semiconductor layer 131a may be lengthily formed, a driving range of the gate voltage applied to the driving gate electrode 125a is increased. Accordingly, since the driving range of a gate voltage may be increased, a gray of light emitted from the organic light emitting diode OLED may be more finely controlled by changing a magnitude of the gate voltage, thereby enhancing resolution of the organic light emitting diode display and improving display quality. The shape of such a driving semiconductor layer 131a is variously modified, and thus various exemplary embodiments such as "'reverse S", "S", "M", "W", and the like are possible.

The driving source electrode 176a corresponds to a driving source region 176a which is doped with the impurity in the driving semiconductor layer 131a, and the driving drain electrode 177a corresponds to a driving drain region 177a which is doped with the impurity in the driving semiconductor layer 131a. The driving gate electrode 125a overlaps with the driving semiconductor layer 131a, and the driving gate electrode 125a is formed on the same layer as the scan line 121, the previous scan line 122, the emission control line 123, a second switching gate electrode 125b, a second compensation gate electrode 125c, a second initialization gate electrode 125d, an operation control gate electrode 125e, and an emission control gate electrode 125f of the same material.

The switching thin film transistor T2 includes a switching semiconductor layer 131b, a switching gate electrode 125b, a switching source electrode 176b, and a switching drain electrode 177b. The switching gate electrode 125b is a portion of the scan line 121. The switching source electrode 176b, which is a part of the data line 171, is connected with a switching source region 132b, which is doped with the impurity in the switching semiconductor layer 131b through a contact hole, and the switching drain electrode 177b corresponds to the switching drain region 177b, which is doped with impurity in the switching semiconductor layer 131b.

The compensation transistor T3 includes a compensation semiconductor layer 131c, a compensation gate electrode 125c, a compensation source electrode 176c, and a compensation drain electrode 177c. The compensation source electrode 176c corresponds to a compensation source region 176c doped with an impurity in the compensation semiconductor layer 131c, and the compensation drain electrode 177c corresponds to a compensation drain region 177c doped with an impurity.

The initialization transistor T4 includes an initialization semiconductor layer 131d, an initialization gate electrode 125d, an initialization source electrode 176d, and an initialization drain electrode 177d. The initialization source electrode 176d corresponds to an initialization source region 176d doped with an impurity, and the initialization drain electrode 177d corresponds to an initialization drain region 177d doped with an impurity. The initialization voltage line 124 may be connected to the initialization semiconductor layer 131d through a contact hole 162.

The operation control transistor T5 includes an operation control semiconductor layer 131e, an operation control gate electrode 125e, an operation control source electrode 176e, and an operation control drain electrode 177e. The operation control source electrode 176e which is a part of the driving voltage line 112 is connected with the operation control semiconductor layer 131e through a contact hole, and the operation control drain electrode 177e corresponds to an operation control drain region 177e doped with an impurity in the operation control semiconductor layer 131e.

The emission control transistor T6 includes an emission control semiconductor layer 131f, an emission control gate electrode 125f, an emission control source electrode 176f, and an emission control drain electrode 177f. The emission control source electrode 176f corresponds to an emission control source region 176f doped with an impurity in the emission control semiconductor layer 131f. The emission control drain electrode 177f may be connected to the emission control semiconductor layer 131f through a contact hole 161.

The bypass thin film transistor T7 includes a bypass semiconductor layer 131g, a bypass gate electrode 115g, a bypass source electrode 176g, and a bypass drain electrode 177g. The bypass source electrode 176g corresponds to a bypass source region 176g doped with an impurity in the bypass semiconductor layer 131g, and the bypass drain electrode 177g corresponds to a bypass drain region 177g doped with an impurity in the bypass semiconductor layer 131g. One end of the driving semiconductor layer 131a of the driving thin film transistor T1 is connected with the switching semiconductor layer 131b and the operation control semiconductor layer 131e, and the other end of the driving semiconductor layer 131a is connected with the compensation semiconductor layer 131c and the emission control semiconductor layer 131f. Accordingly, the driving source electrode 176a is connected with the switching drain electrode 177b and the operation control drain electrode 177e, and the driving drain electrode 177a is connected with the compensation source electrode 176c and the emission control source electrode 176f. The storage capacitor Cst includes a first storage capacitive plate 125a and a second storage capacitive plate 126 disposed with a third gate insulating layer 142 therebetween. The first storage capacitive plate 125a is the driving gate electrode 125a, the third gate insulating layer 142 is a dielectric material, and a storage capacitance is determined by a charge charged in the storage capacitor Cst and a voltage between both storage capacitive plates 125a and 126.

The second storage capacitive plate 126 may be connected to the connection line 112c of the driving voltage line 112 through a contact hole, and may have a larger area than the first storage capacitive plate 125a. A portion of the second storage capacitive plate 126 connected to the connection line 112c is an expanded portion, does not overlap the first storage capacitive plate 125a, and may be connected to the connection line 112c intersecting between the first storage capacitive plate 125a and the substrate 110.

A connecting member 174 is formed to be parallel with and on the same layer as that of the data line 171, and connects the driving gate electrode 125a and the compensation drain electrode 177c of the compensation thin film transistor T3. The first storage capacitive plate 125a as the driving gate electrode 125a is connected to the connecting member 174 through a contact hole and the compensation drain electrode 177c is connected to the connecting member 174 through a contact hole at the compensation semiconductor layer 131c. Accordingly, the storage capacitor Cst stores a storage capacitance corresponding to a difference between the driving voltage ELVDD transmitted to the second storage capacitive plate 126 through the driving voltage line 112 and the gate voltage of the driving gate electrode 125a.

The switching transistor T2 is used as a switching element for selecting a pixel desired to emit light. The switching gate electrode 125b is connected to the scan line 121, the switching source electrode 176b is connected to the data line 171, and the switching drain electrode 177b is connected to the driving transistor T1 and the operation control transistor T5. Further, the light emission drain electrode 177f of the light emission control transistor T6 is directly connected with the pixel electrode 191.

Hereinafter, a stacking sequence in the cross-sectional structure of the display device according to the exemplary embodiment of the present invention will be described in detail with reference to FIGS. 11 to 15 as well as FIGS. 8 to 10. A stacking structure of the operation control transistor T5 is mostly the same as a stacking structure of the light emission control transistor T6, so that a detailed description thereof will be omitted.

Figure 11:
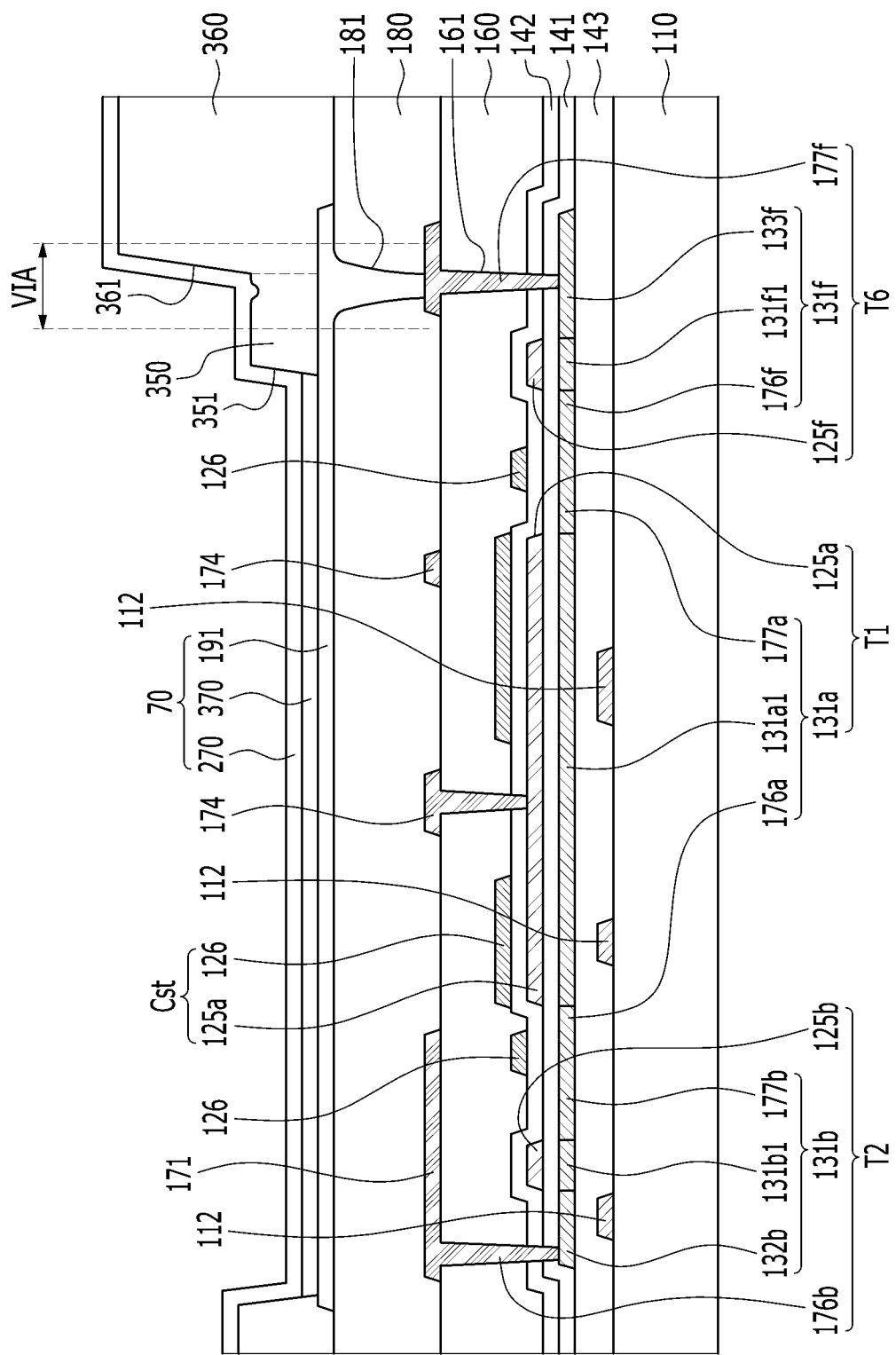
FIG. 11 is a cross-sectional view of the display device of FIG. 10 taken along the line XI-XI.
Figure 15:
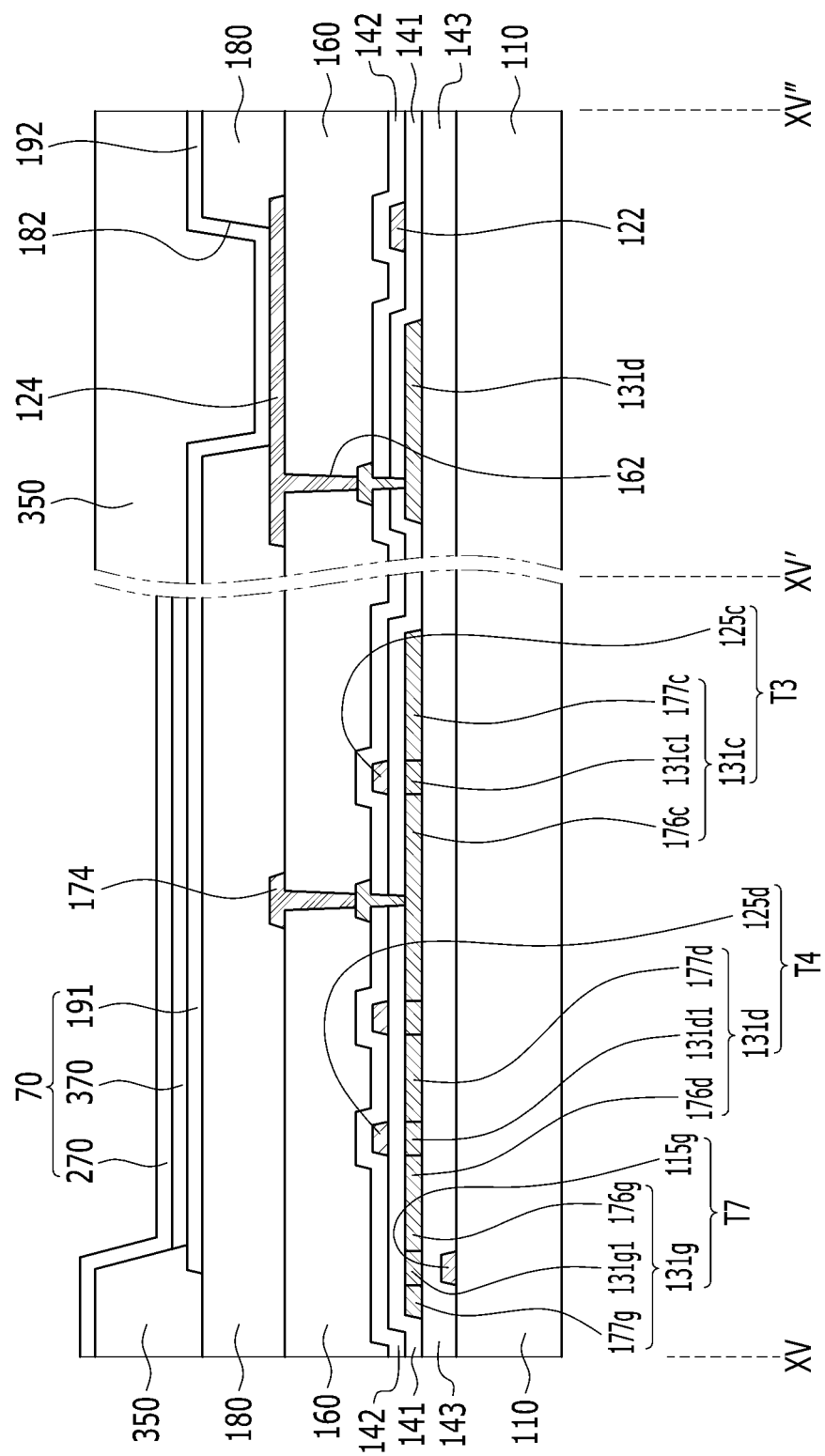
FIG. 15 is a cross-sectional view of the display device of FIG. 10 taken along lines XV-XV' and XV'-XV".

Referring to FIGS. 11 and 15, a bypass control line 118, a driving voltage line 112, and a bypass gate electrode 115g are formed a substrate 110, and a first gate insulating layer 143 may directly cover them. The substrate 110 may include glass, quartz, ceramic, or plastic. The bypass control line 118, the driving voltage line 112, and the bypass gate electrode 115g are arranged between the semiconductor layer 131 and the substrate 110, and thereby the bypass gate electrode 115g is arranged between the bypass semiconductor layer 131g and the substrate 110. That is, the bypass transistor T7 is formed as a bottom gate transistor, differently from the driving transistor T1, the switching transistor T2, the compensation transistor T3, the initialization transistor T4, the operation control transistor T5, and the emission control transistor T6 which are respectively formed as a top gate transistor.

A driving semiconductor layer 131a, a switching semiconductor layer 131b, a compensation semiconductor layer 131c, an initialization semiconductor layer 131d, an operation control semiconductor layer 131e, an emission control semiconductor layer 131f, and a bypass semiconductor layer 131g are formed on the first gate insulating layer 143.

The driving semiconductor layer 131a includes a driving channel region 131a1, and a driving source region 176a and a driving drain region 177a facing each other via the driving channel region 131a1 interposed therebetween, and the switching semiconductor layer 131b includes a switching channel region 131b1, and a switching source region 132b and a switching drain region 177b facing each other via the switching channel region 131b1 interposed therebetween. Also, the compensation semiconductor layer 131c includes a compensation channel region 131c1, a compensation source region 176c, and a compensation drain region 177c, the initialization semiconductor layer 131d includes an initialization channel region 131d1, an initialization source region 176d, and an initialization drain region 177d, the emission control semiconductor layer 131f includes an emission control channel region 131f1, an emission control source region 176f, and an emission control drain region 133f, and the bypass semiconductor layer 131g includes a bypass channel region 131g1, a bypass source region 176g, and a bypass drain region 177g.

A second gate insulating layer 141 is formed on the driving semiconductor layer 131a, the switching semiconductor layer 131b, the compensation semiconductor layer 131c, the initialization semiconductor layer 131d, the operation control semiconductor layer 131e, the emission control semiconductor layer 131f, and the bypass semiconductor layer 131g.

The second gate insulating layer 141 directly covers a semiconductor layer 131 including the driving semiconductor layer 131a, the switching semiconductor layer 131b, the compensation semiconductor layer 131c, the initialization semiconductor layer 131d, the operation control semiconductor layer 131e, the emission control semiconductor layer 131f, and the bypass semiconductor layer 131g. Gate wires 121, 122, 123, 125a, 125b, 125c, 125d, 125e, and 125f including a scan line 121 including a switching gate electrode 125b and a compensation gate electrode 125c, a previous scan line 122 including an initialization gate electrode 125d, an emission control line 123 including an operation control gate electrode 125e and an emission control gate electrode 125f, and a driving gate electrode (first storage capacitive plate) 125a are formed on the second gate insulating layer 141.

A third gate insulating layer 142 is formed on the gate wires 121, 122, 123, 125a, 125b, 125c, 125d, 125e, and 125f and the second gate insulating layer 141. The third gate insulating layer 142 directly covers the scan line 121 including the switching gate electrode 125b and the compensation gate electrode 125c, the previous scan line 122 including the initialization gate electrode 125d, the emission control line 123 including the operation control gate electrode 125e and the emission control gate electrode 125f, and the driving gate electrode (first storage capacitive plate) 125a. The second gate insulating layer 141 and the third gate insulating layer 142 are formed of a silicon nitride ($SiN_x$) or a silicon oxide ($SiO_x$).

A second storage capacitive plate 126 overlapping the first storage capacitive plate 125a is formed on the third gate insulating layer 142.

An interlayer insulating layer 160 is arranged on the third gate insulating layer 142 and the second storage capacitive plate 126. The interlayer insulating layer 160 may include a ceramic-based material such as a silicon nitride ($SiN_x$) or a silicon oxide ($SiO_x$). The interlayer insulating layer 160, the second gate insulating layer 141, and the third gate insulating layer 142 may include a contact hole 161 exposing the emission control semiconductor layer 131f and a contact hole 162 exposing the initialization semiconductor layer 131d.

Data wires 171, 174, 176b, and 177f including a data line 171, a switching source electrode 176b, a connecting member 174, an emission control drain electrode 177f, and an initialization voltage line 124 may be arranged on the interlayer insulating layer 160. Among the data wires 171, 174, 176b, and 177f, the emission control drain electrode 177f may be electrically and physically connected to the emission control semiconductor layer 131f through the contact hole 161. The initialization voltage line 124 may be electrically and physically connected to the initialization semiconductor layer 131d through the contact hole 162.

A passivation layer 180 covering the data wires 171, 174, 176b, and 177f is arranged on the interlayer insulating layer 160. The passivation layer 180 may include the organic insulating material or the inorganic insulating material. The passivation layer 180 may include a via hole 181 exposing the emission control drain electrode 177f and a via hole 182 exposing the initialization voltage line 124.

A pixel electrode 191 and an initialization voltage transmitting electrode 192 may be arranged on the passivation layer 180. The pixel electrode 191 may be electrically and physically connected to the emission control drain electrode 177f through the via hole 181 formed in the passivation layer 180. The initialization voltage transmitting electrode 192 may be electrically and physically connected to the initialization voltage line 124 through the via hole 182 formed in the passivation layer 180. The initialization voltage transmitting electrode 192 may transmit the initialization voltage Vint to the initialization voltage line 124.

A pixel definition layer 350 is formed at the edge of the pixel electrode 191, on the passivation layer 180, and on the initialization voltage transmitting electrode 192, and the pixel definition layer 350 includes an opening 351 exposing the pixel electrode 191. The pixel definition layer 350 may cover both via holes 181 and 182.

Referring to FIG. 11, as described above, a spacer 360 is arranged on the pixel definition layer 350, and the spacer 360 does not completely cover the via hole 181. According to an exemplary embodiment of the present invention, the edge side surface 361 of the spacer 360 arranged to be adjacent to the via hole 181 may overlap the region where the via hole 181 of the passivation layer 180 is formed, that is, the via hole region VIA. Accordingly, the concave shape of the via hole 181 is not transferred to the upper surface of the spacer 360 because the concave shape is not generated at the upper surface of the spacer 360 and the external light may be prevented from being diffused-reflected.

Referring to FIG. 11, the spacer 360 may be formed of the same material as the pixel definition layer 350, and they may be simultaneously formed by using a photomask including the halftone region.

In FIG. 15, although the spacer 360 formed to be adjacent to the via hole 182 is not shown, when the spacer 360 is formed near the via hole 182, the spacer 360 does not completely cover the via hole 182 and only overlaps the portion of the via hole 182 such that the diffused reflection of the external light due to the concave shape of the via hole 182 may be prevented. In this case, the edge side surface 361 of the spacer 360 adjacent to the via hole 182 may overlap the via hole region where the via hole 182 is formed.

An emission layer 370 is formed on a portion of the pixel electrode 191 that is exposed at the opening 351 of the pixel definition layer 350, and an opposed electrode 270 is formed on the emission layer 370. As described above, an organic light emitting element 70 including the pixel electrode 191, the emission layer 370, and the opposed electrode 270 is formed.

Holes and electrons from the pixel electrode 191 and the opposed electrode 270 respectively are injected into the organic emission layer 370, and when excitons, being combinations of the injected holes and electrons, fall from an excited state to a ground state, light is emitted.

The emission layer 370 may be made of a low molecular weight organic material or a high molecular weight organic material such as poly3,4-ethylenedioxythiophene (PEDOT). The emission layer 370 may be made with multiple layers including an emission layer and at least one of a hole injection layer (HIL), a hole transport layer (HTL), an electron transport layer (ETL), and an electron injection layer (EIL). In the case where the organic emission layer 370 includes all the above layers, the hole injection layer (HIL) is disposed on a pixel electrode 191 which is an anode, and the hole transporting layer (HTL), the emission layer, the electron transporting layer (ETL), the electron injection layer (EIL) are sequentially laminated thereon.

The organic emission layer 370 may include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, thereby realizing various color images.

Further, the organic emission layer 370 may realize the color image by laminating the red organic emission layer, the green organic emission layer, and the blue organic emission layer together in the red pixel, the green pixel, and the blue pixel, and forming a red color filter, a green color filter, and a blue color filter for each pixel. In another example, white organic emission layers emitting white light are formed in all of the red pixel, the green pixel, and the blue pixel, and a red color filter, a green color filter, and a blue color filter are formed for each pixel, thereby implementing the color image. In the case of implementing the color image by using the white organic emission layer and the color filters, a deposition mask for depositing the red organic emission layer, the green organic emission layer, and the blue organic emission layer on respective pixels, that is, the red pixel, the green pixel, and the blue pixel, does not need to be used.

An encapsulation member (not illustrated) protecting the organic light emitting element 70 may be formed on the opposed electrode 270, and the encapsulation member may be encapsulated on the substrate 110 by a sealant, and may be made of various materials such as glass, quartz, ceramic, plastic, and metal. Meanwhile, a thin film encapsulation layer may be formed by depositing an inorganic layer and an organic layer on the opposed electrode 270 without using the sealant.

Figure 12:
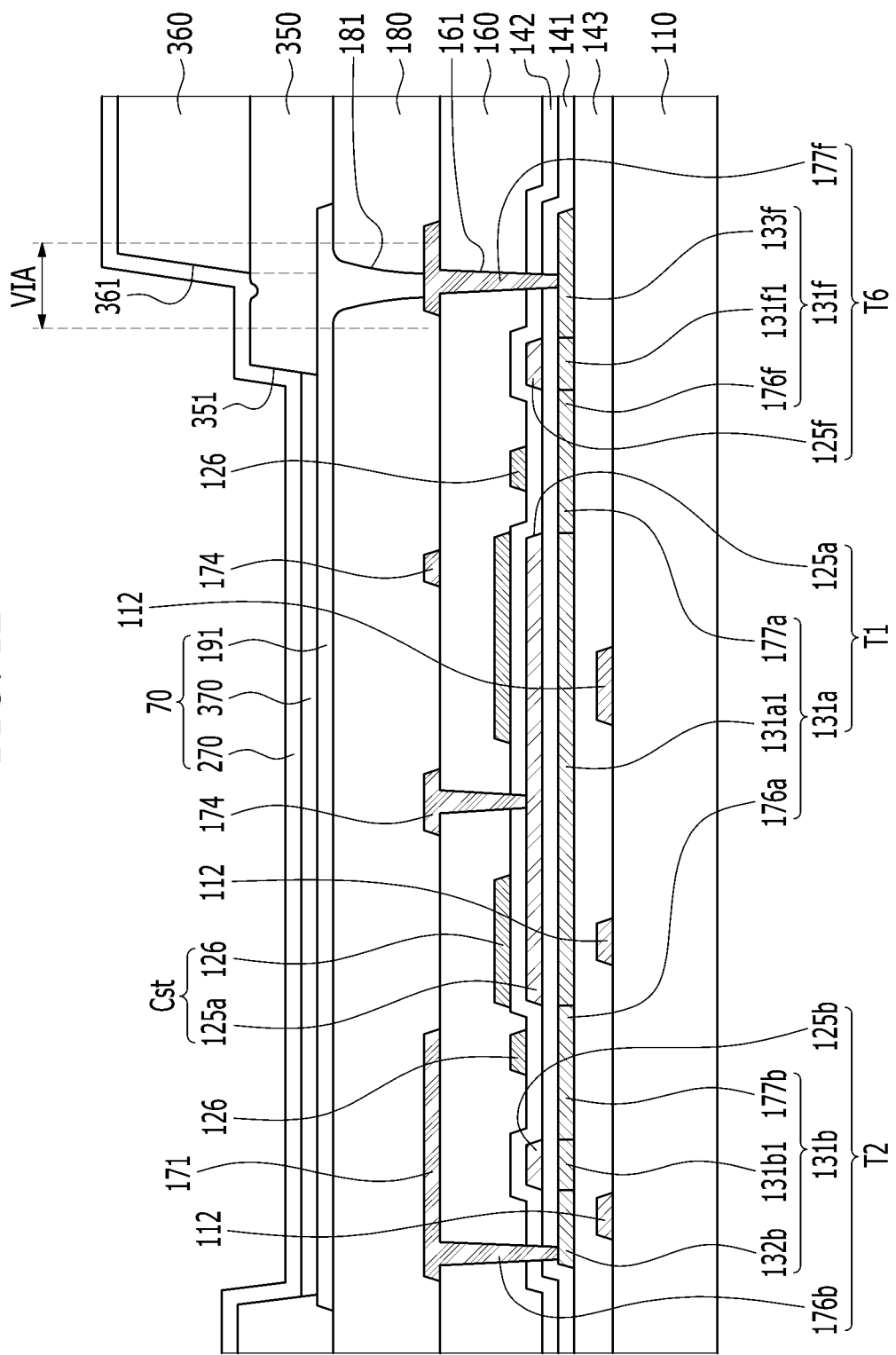
FIG. 12, FIG. 13, and FIG. 14 are other examples of a cross-sectional view of the display device of FIG. 10 taken along the line XI-XI.
Figure 13:
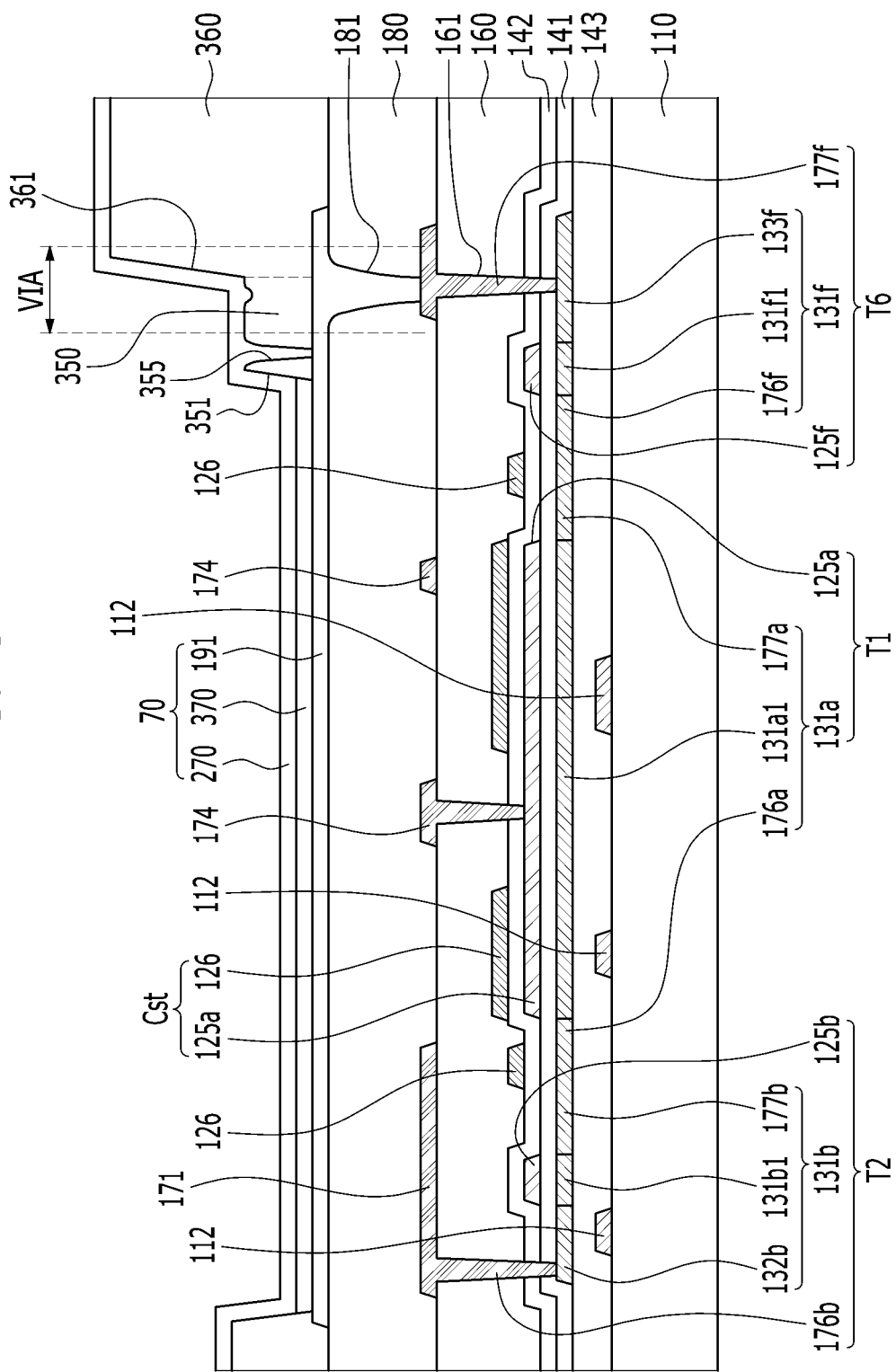
Figure 14:
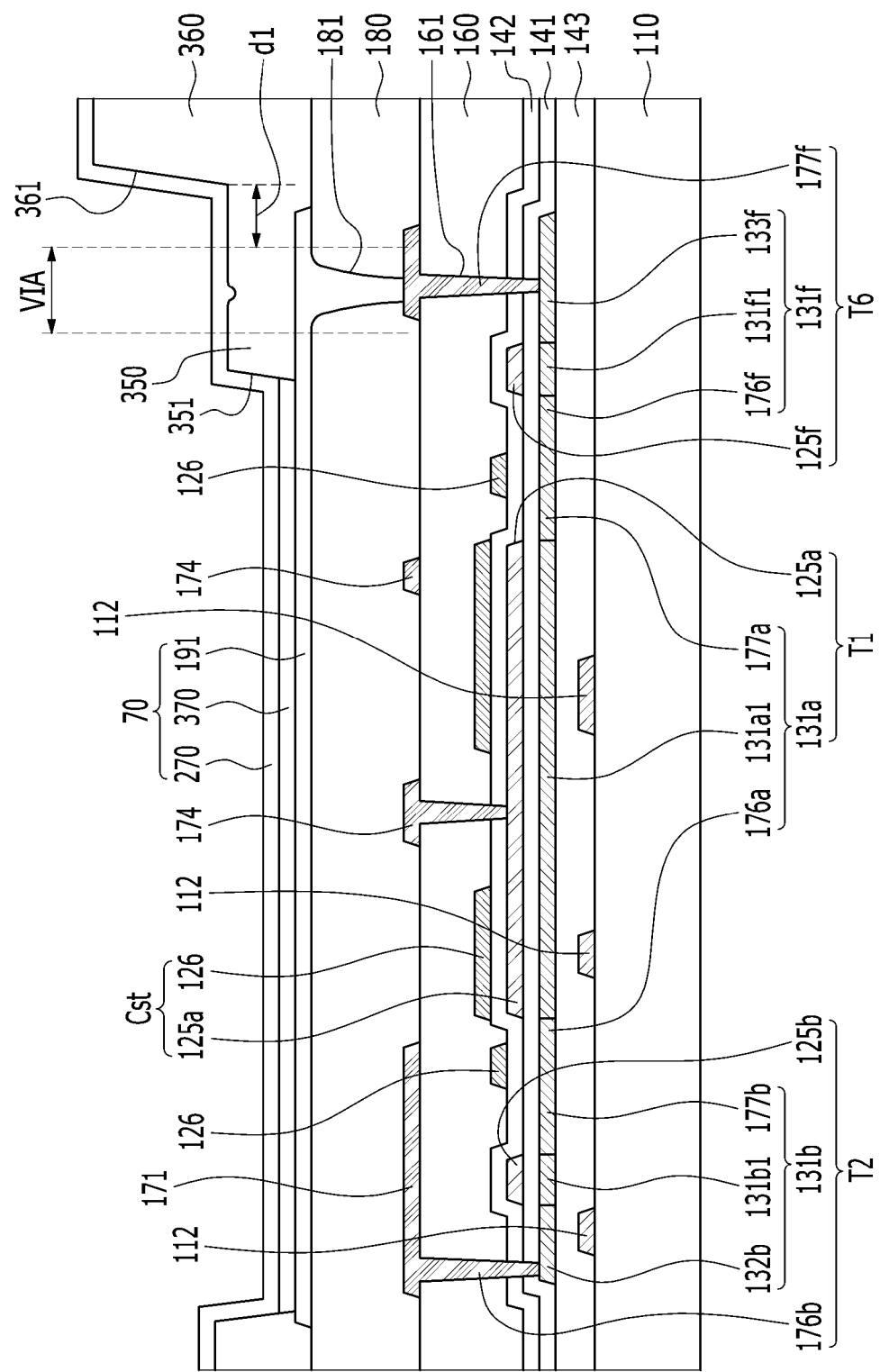

Next, another structure of the display device according to an exemplary embodiment of the present invention will be described with reference to FIGS. 12 to 14 in addition to FIGS. 10, 11 and 15. FIG. 12, FIG. 13, and FIG. 14 show another example of the cross-sectional view of the display device of FIG. 10 taken along the line XI-XI.

First, referring to FIG. 12, the display device according to an exemplary embodiment of the present invention is the same as most of the exemplary embodiment shown in FIG. 11, however the spacer 360 may include a different material from the pixel definition layer 350 and may be arranged on the pixel definition layer 350, differently from the exemplary embodiment shown in FIG. 11. In this case, the spacer 360 may be formed through a different process from the pixel definition layer 350 by using a different photomask.

Referring to FIG. 13, the display device according to an exemplary embodiment of the present invention is the same as most of the exemplary embodiment shown in FIG. 11, however the pixel definition layer 350 further includes an opening 355 arranged near the via hole 181. The width of the opening 355 of the pixel definition layer 350 may be equal to or less than the width of the adjacent via hole 181. The opening 355 may not overlap the via hole 181.

Referring to FIG. 14, the display device according to an exemplary embodiment of the present invention is the same as most of the exemplary embodiment shown in FIG. 11, however the edge side surface 361 of the spacer 360 adjacent to the via hole 181 may be arranged outside the via hole region VIA. In this case, the distance d1 between the edge side surface 361 of the spacer 360 and the edge boundary of the via hole region VIA may be determined as an appropriate distance at which the diffused reflection of the external light may not be generated. For example, the distance d1 between the edge side surface 361 of the spacer 360 and the edge boundary of the via hole region VIA may be less than about a width of the via hole region VIA, but is not limited thereto.

The inventors of the present invention have recognized the problem of optical distortion caused by the via holes 181 in a display device and in a display panel, the via hole being formed in a thick insulating layer such as a passivation layer 180 to connect an electrode 151 of a thin film transistor (TFT) arranged below the thick insulating layer 180 to a pixel electrode 191 of a light emitting device arranged above the thick insulating layer 180. According to the principles of the present invention, a spacer layer 360 is arranged on top of a pixel definition layer 350 and has a side edge portion 361 that either extends through the via holes 181 or extend near the via holes. The edge side edge of the spacer may have an inclined angle between 10 and 90°, may be comprised of an insulating material that is transparent to visible light, and may be comprised of a same material as the underlying pixel defining layer 350. By having the edge portion 361 of spacer 360 arranged near or through the via hole, the optical distortion that ordinarily would be caused by the presence of the via hole is eliminated, removing the possibility of a staining effect caused by the via hole.

There are many variations to the present invention. These include forming the spacer 360 of a same material as the underlying pixel defining layer 350 or of a different material than underlying pixel defining layer 350, including an additional opening 355 in the pixel defining layer 350 located near but now within the via hole 181, having the edge 361 of the spacer 360 extend though all of the different colored via holes 181, some of the via holes 181, or none of the via holes by having the edge 361 of spacer 360 spaced apart from each via hole by a distance d1, having the spacer 360 of the shape of a rectangle, having the spacer of a shape of a triangle, and varying the location of the spacer with respect to the red, green and blue sub pixels. In each of these embodiments and variations of the present invention, the edge 361 of the spacer 360 and the opening 355 serve to prevent the distortion of light caused by the via holes 181 and to prevent the staining effect caused by the via holes 181.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

110: substrate
150 semiconductor element layer
151 electrode
160: interlayer insulating layer
161, 162: contact hole
80: passivation layer
181, 182: via hole
191: pixel electrode
270: opposed electrode
350: pixel definition layer
351 opening (first)
355 opening (second)
360: spacer
361 edge side surface of spacer
370: emission layer

What is claimed is:

1. A display device, comprising:
   a semiconductor element including a first electrode;
   a passivation layer arranged on the semiconductor element and including a via hole exposing the first electrode;
   a second electrode arranged on the passivation layer and connected to the first electrode through the via hole; and
   a spacer arranged on the second electrode and adjacent to the via hole, wherein the spacer exposes at least a portion of a region where the via hole is arranged.

2. The display device of claim 1, wherein the spacer includes a first edge side surface overlapping the region where the via hole is arranged.

3. The display device of claim 2, further comprising a pixel definition layer arranged on the second electrode and including a first opening exposing the second electrode.

4. The display device of claim 3, wherein the pixel definition layer covers the via hole.

5. The display device of claim 4, wherein the spacer is arranged on the pixel definition layer.

6. The display device of claim 5, wherein the pixel definition layer further includes a second opening arranged adjacent to the via hole.

7. The display device of claim 4, wherein the spacer and the pixel definition layer are comprised of a same material.

8. The display device of claim 2, wherein the first edge side surface of the spacer overlaps a plurality of the via holes.

9. The display device of claim 1, further comprising a third electrode arranged on the pixel definition layer and the spacer.

10. The display device of claim 2, further comprising a pixel definition layer arranged on the second electrode, covering the via hole, and being comprised of a same material as the spacer, the first edge side surface to prevent external light from being diffused and distorted by a concave shape of the second electrode arranged within the via hole.

11. The display device of claim 1, the spacer being comprised of an optically transparent and electrically insulating material.

12. The display device of claim 2, the semiconductor element being arranged on a substrate, the first edge side surface of the spacer forming an angle with a surface of the substrate that is larger than about 10 degrees and is less than 90 degrees.

13. The display device of claim 2, the first edge side surface being spaced apart from the via hole by a distance less than a width of the via hole.

14. The display device of claim 2, the first edge side surface overlapping the via hole to prevent the via hole from producing optical distortions and stains from external light by preventing a concave shape of the via hole from transferring and being present on an outer surface of the display device and preventing the external light from being diffused and reflected by the concave shape of the via hole.

15. The display device of claim 6, wherein a combination of the second opening being adjacent to the via hole and the first edge side surface overlapping the via hole to prevent the via hole from producing optical distortions and stains from external light by preventing a concave shape of the via hole from transferring and being present on an outer surface of the display device and preventing the external light from being diffused and reflected by the concave shape of the via hole.

16. The display device of claim 3, the spacer and the pixel defining layer each being comprised of a same material selected from a group consisting of photoresist, polyacrylate-based resin, polyimide-based resin, acryl-based resin, silicon dioxide and silicon nitride.

17. The display device of claim 3, the spacer being a portion of the pixel defining layer having a second and greater thickness than a remaining portion of the pixel defining layer external to the first opening having a first and lesser thickness.

18. A display device, comprising:
    an insulating substrate;
    a semiconductor element arranged on the substrate;
    a first electrode arranged on the semiconductor element;
    a passivation layer arranged on the semiconductor element and being perforated by a via hole exposing the first electrode;
    a second electrode arranged on the passivation layer and connected to the first electrode through the via hole; and
    a pixel defining layer arranged on the second electrode and on the passivation layer, the pixel defining layer being perforated by a first opening exposing a portion of the second electrode, the pixel defining layer having a first portion external to the first opening and having a first thickness and corresponding to at least a portion of the via hole, the pixel defining layer also including a second portion having a second and greater thickness and a first edge side surface connecting the first and second portions.

19. The display device of claim 18, the pixel defining layer being comprised of a material selected from a group consisting of photoresist, polyacrylate-based resin, polyimide-based resin, acryl-based resin, silicon dioxide and silicon nitride, the first edge side surface forming an angle with a surface of the substrate that is larger than about 10 degrees and is less than 90 degrees.

20. The display device of claim 18, the second electrode being arranged within the via hole and forming a concave surface with respect to a front surface of the display device, the first edge side surface of the pixel defining layer to prevent external light from being distorted by the second electrode within the via hole and to prevent external light from reflecting off of the concave surface of the second electrode within the via hole.

* * * * *